United States Patent
Fisch

(10) Patent No.: US 11,398,258 B2
(45) Date of Patent: Jul. 26, 2022

(54) MULTI-DIE MODULE WITH LOW POWER OPERATION

(71) Applicant: Invensas LLC, San Jose, CA (US)

(72) Inventor: David Edward Fisch, Pleasanton, CA (US)

(73) Assignee: Invensas LLC, San Jose, CA (US)

( * ) Notice: Subject to any disclaimer, the term of this patent is extended or adjusted under 35 U.S.C. 154(b) by 0 days.

(21) Appl. No.: 16/397,569

(22) Filed: Apr. 29, 2019

(65) Prior Publication Data

US 2019/0333550 A1 Oct. 31, 2019

Related U.S. Application Data

(60) Provisional application No. 62/664,728, filed on Apr. 30, 2018.

(51) Int. Cl.
| | |
|---|---|
| *G11C 5/14* | (2006.01) |
| *H01L 25/065* | (2006.01) |
| *H01L 27/108* | (2006.01) |
| *G11C 7/10* | (2006.01) |
| *G11C 11/406* | (2006.01) |
| *G11C 5/04* | (2006.01) |
| *G11C 5/06* | (2006.01) |
| *G11C 11/4074* | (2006.01) |

(52) U.S. Cl.
CPC ............... *G11C 5/147* (2013.01); *G11C 5/04* (2013.01); *G11C 5/063* (2013.01); *G11C 5/145* (2013.01); *G11C 7/1063* (2013.01); *G11C 11/4074* (2013.01); *G11C 11/40615* (2013.01); *H01L 25/0657* (2013.01); *H01L 27/10897* (2013.01)

(58) Field of Classification Search
CPC ....................................................... G11C 5/147
See application file for complete search history.

(56) References Cited

U.S. PATENT DOCUMENTS

| | | |
|---|---|---|
| 5,552,740 A | 9/1996 | Casper |
| 6,335,895 B1 | 1/2002 | Sugibayashi |
| 7,200,021 B2 | 4/2007 | Raghuram |
| 7,992,020 B1 | 8/2011 | Tuan et al. |
| 8,638,006 B2 | 1/2014 | Im |

(Continued)

OTHER PUBLICATIONS

Bhat, B. et al., "Making DRAM Refresh Predictable," NC State University, Sep. 2011, 10 pages.

Black, B. et al., "3D processing technology and its impact on iA32 microprocessors," In proceedings of the 2004 IEEE International Conference on Computer Design, Oct. 2004, pp. 316-318.

(Continued)

*Primary Examiner* — Douglas King
(74) *Attorney, Agent, or Firm* — Haley Guiliano LLP

(57) ABSTRACT

A module for multiple dies is disclosed. The module can include a group of dies that include a first die having a first voltage block and a second die having a second voltage block. The module can also include an interconnect that electrically connects the first and second dies. Power supply generation in the first die is enabled in non-active mode, while power supply generation in the second die is disabled. The power supply generation in the second die may be enabled when the second die is in active mode. The first die can send enabling signal to the second the die to enable the second die. The first die can provide supply to the second die in the non-active mode. The first die can send self-refresh timing command to the second die when the module is in a self-refresh mode.

24 Claims, 14 Drawing Sheets

(56) References Cited

U.S. PATENT DOCUMENTS

| | | | |
|---|---|---|---|
| 8,878,351 B2 | 11/2014 | Suzuki et al. | |
| 8,878,387 B1 | 11/2014 | Wong et al. | |
| 9,378,778 B1 | 6/2016 | Walker | |
| 2007/0070766 A1* | 3/2007 | Kim | G11C 5/145 |
| | | | 365/222 |
| 2009/0020855 A1 | 1/2009 | Pyeon | |
| 2012/0250443 A1 | 10/2012 | Saraswat et al. | |
| 2012/0254641 A1 | 10/2012 | Rotem et al. | |
| 2014/0063887 A1* | 3/2014 | Vogelsang | G11C 5/063 |
| | | | 365/51 |
| 2015/0168973 A1 | 6/2015 | Barber | |
| 2016/0109922 A1 | 4/2016 | Chen et al. | |
| 2017/0003707 A1 | 1/2017 | Henry et al. | |
| 2018/0096719 A1* | 4/2018 | Tomishima | G11C 5/025 |
| 2018/0366442 A1* | 12/2018 | Gu | H01L 25/50 |

OTHER PUBLICATIONS

Black, B. et al., "Die Stacking (3D) Microarchitecture," Intel® Corporation, Dec. 2006, 11 pages.

Gutmann, R.J. et al., "Three-dimensional (3D) ICs: a technology platform for integrated systems and opportunities for new polymeric adhesives," In Proceedings of the First International Conference on Polymers and Adhesives in Microelectronics and Photonics, Oct. 2001, pp. 173-180.

Reed, P. et al., "Design aspects of a microprocessor data cache using 3D die interconnect technology," In Proceedings of the International Conference on Integrated Circuit Design and Technology, May 2005, pp. 15-18.

International Search Report and Written Opinion for International Application No. PCT/US2019/029821 dated Aug. 29, 2019, in 18 pages.

* cited by examiner

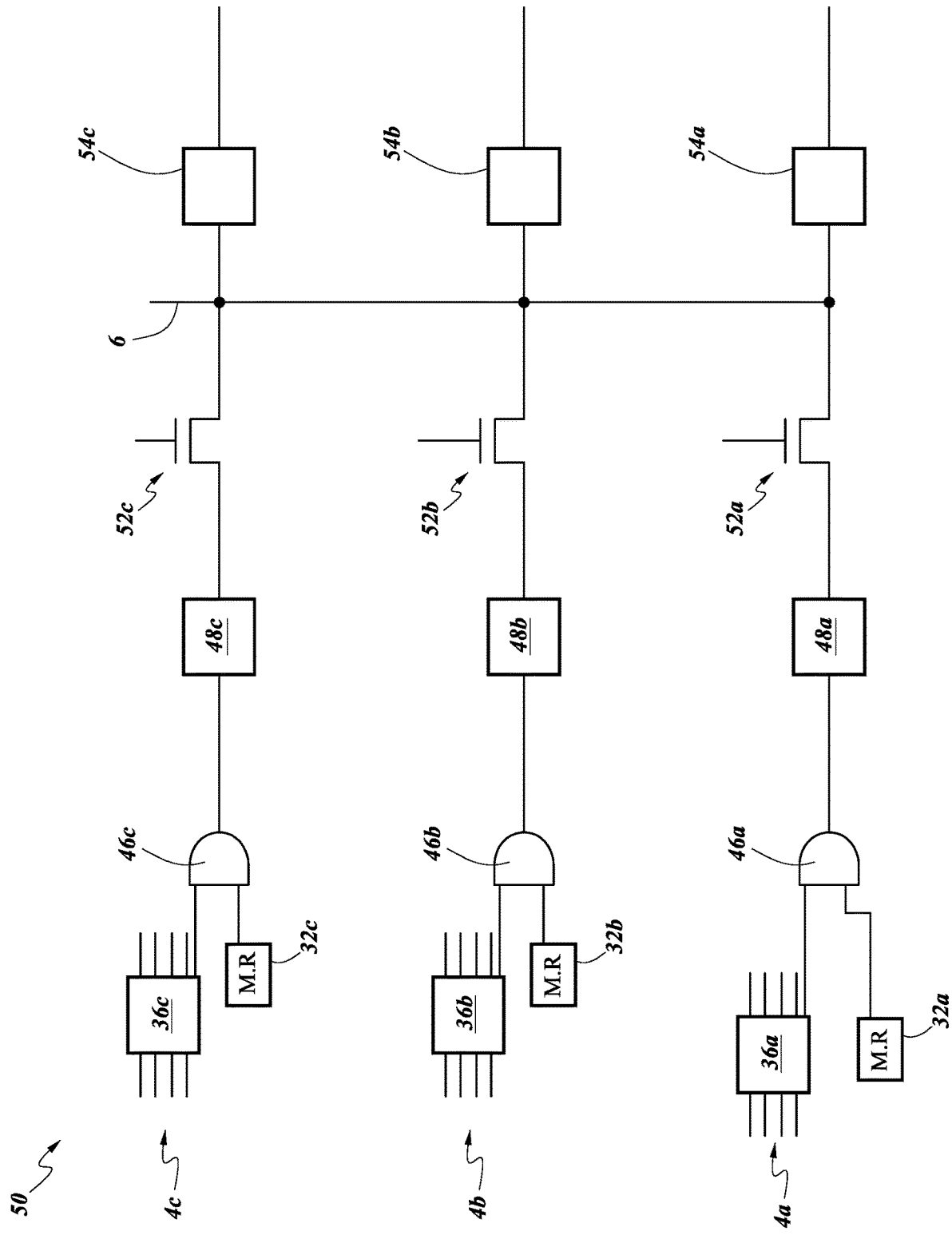

MULTI-DIE MODULE WITH LOW POWER OPERATION

CROSS-REFERENCE TO RELATED APPLICATIONS

This application claims priority to U.S. Provisional Patent Application No. 62/664,728, filed Apr. 30, 2018, titled "MULTI-DIE MODULE WITH LOW POWER OPERATION," the entire contents of which are hereby incorporated herein by reference.

BACKGROUND

Field

The disclosure relates generally to die modules and more specifically, to multi-die modules that allow for a low power operation mode.

Description of the Related Art

In multiple die configurations, such as stacked memories dies (e.g., dynamic random-access memory or DRAM), each die can generate one or more internal power supplies using voltage regulation circuits, often combined with charge pumps and other voltage control circuits. It is desirable to distribute power supplies among all the dies both to allow manufacturing identical dies, and to avoid voltage differences due to path differences from external power supplies.

BRIEF DESCRIPTION OF THE DRAWINGS

FIG. 7 shows a diagram of a system for a self-refresh mode (SRM) in a group of devices connected by signal interconnect.

DETAILED DESCRIPTION

Figure 1:
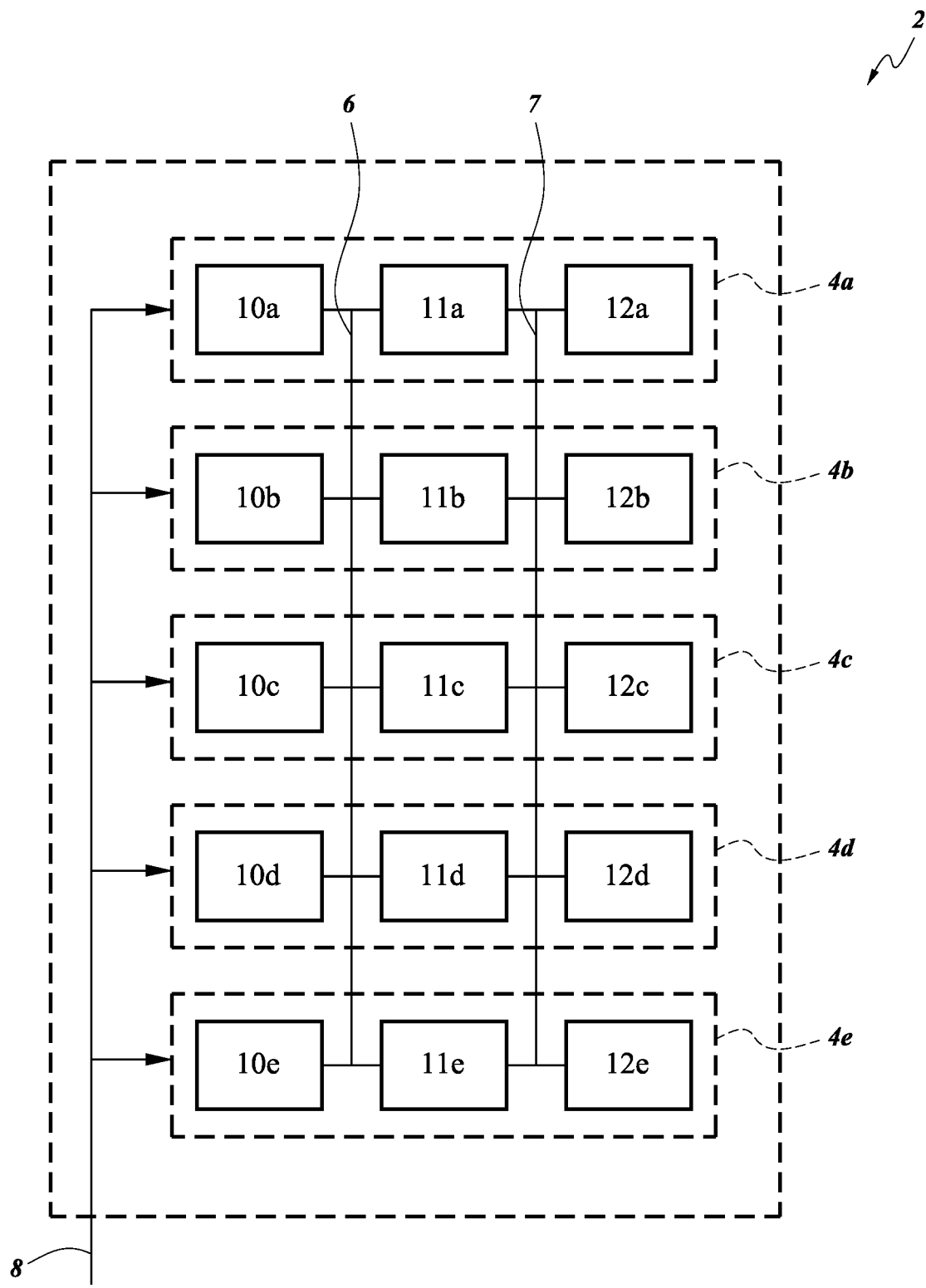
FIG. 1 is a schematic diagram of a group of devices organized in a module, including first to fifth semiconductor devices, according to one embodiment.

While separate internal power supplies are desirable for reasons noted above, power consumption is increased by such arrangements. Accordingly, there is a need for reduced power consumption among grouped dies, such as memory chips.

Various embodiments disclosed herein relate to multiple dies with internal voltage circuit blocks that can be used to maintain power supply levels such that the product meets functional and/or parametric specifications. Examples of functional specifications may include read and write latency, data out frequencies, data retention times, set up and hold times, functional operation over temperature, etc. Parametric specifications can include standby power, active power, input and output levels, etc.

Voltage circuit blocks (also referred herein as voltage blocks) may include voltage regulators and/or voltage generator circuits, such as charge pumps to generate voltages that are at different levels from or simply more stable than external sources. Voltage blocks may have the regulators and the voltage generation circuits in close proximity to each other or they may be distributed across an individual die.

The embodiments disclosed herein can be particularly beneficial for grouped dies in a package, such as modules in stacked die configurations. Non-limiting examples include memory modules that include stacked memories, such as dynamic random-access memory (DRAM) chips. However, it should be understood that the embodiments disclosed herein can also be beneficial for dies connected in any other ways, particularly but not exclusively for commonly packaged dies in a module (for instance, a multi-chip module or MCM).

As noted above, it can be desirable to have distributed power regulation among the multiple grouped chips. In certain implementations, the chips correspond to semiconductor dies having the same design or part number. However, even during non-active modes (such as standby operation mode and/or sleep mode), power regulation blocks may consume power, which is of concern generally and particularly for today's mobile and wearable market. For example, in case of a stacked die memory module, current consumption during a non-active mode (e.g., standby mode, sleep mode, etc.) can be a relatively large drain on the battery when many voltage blocks (e.g., pumps and or regulators) on each die consume power during the non-active mode.

Accordingly, in embodiments taught herein, one or more dies in a group of multiple dies can be designated to provide at least some of the functions of the remaining die(s) of the group, or to a subset of the group, in certain operational modes. For example, a die may be designated as a master die and the remaining dies, or a subset of them, can serve as slave dies in a non-active mode. The term "master" is employed herein for dies that are configured or designated to keep their voltage blocks in an active mode while other die(s) in the group are in non-active modes, in which less power is consumed that in an active mode. Such configuration or designation can be provided in any suitable way, including, but not limited to, programming the dies with master/slave configuration data over an interface or bus, controlling of fuses and/or anti-fuses, and/or any other suitable configuration scheme.

In some embodiments, voltage blocks of the master die can provide voltage for operation of both the master die and the slave dies in a non-active mode. In some embodiments, the master die may additionally or alternatively provide control signals to the slave dies. Active and non-active modes may refer to the status of a single die, or to the group of dies (e.g., module, which may be commonly packaged). When the group of dies is in a non-active mode, the master die(s) of the group has its voltage blocks enabled. Accordingly, a master die can be considered to remain in active mode even when the group it belongs to is in non-active modes. Therefore, the master die may be in a high power mode when the slave die(s) may be in either a low power mode or in a high power mode. Depending on the power supply loading level in a non-active mode, the number of voltage blocks in a master die that remain active may be varied. The skilled artisan will appreciate that the foregoing description does not preclude the master die from having other modes, including low power or inactive modes, under other conditions, in some embodiments. For example, where data retention is not required in a volatile memory application, voltage blocks of the master die may be disabled.

In some embodiments, the master die provides voltages for certain slave die operations in a non-active mode and/or provides control signals to the slave dies. In other embodiments, the master die provides voltages for certain slave die operations, but control signals for such operations are processed within the slave die(s), such as by a local command decoder. Such control signals can enable and/or disable voltage blocks in the rest of or in a subset of the group.

For example, the control signals may disable voltage regulators in the slave dies in a non-active mode (e.g., standby mode, sleep mode, etc.) where the power draw on the regulated supplies is low enough such that one or more of the voltage blocks of the one or more dies in the group can provide enough control (e.g., correct voltage levels, sufficient voltage stability, etc.) to keep the regulated supplies sufficiently stable to allow product to meet functional and parametric specifications.

Similarly, control signals can be used, for example, to selectively enable and/or disable charge pumps and/or other voltage generation circuits in the slave dies. For example, a memory module can include a group of memory dies stacked vertically. Each memory die can include one or more internal voltage blocks. In one condition, e.g., non-active mode, the designated master die has its internal voltage block enabled and the slave dies can have their internal voltage block disabled, such that their power draw can be significantly reduced in a non-active mode. In some embodiments, the voltage blocks may include more than one voltage regulating/generating circuits (e.g., voltage regulators, charge pumps, etc.). In another condition, e.g., active mode, the internal voltage blocks of the slave dies can be enabled to provide internally generated voltages locally for each die.

In some embodiments, a module may have more than one master die designated, each capable of supplying voltages to one or more slave die(s), at least for some operations in non-active (or low power) modes. The function of enabling and disabling voltage blocks of slave dies can be handled by control circuits (e.g., command modules) within the slave die(s) in some embodiments, by signals from the master die in other embodiments, and/or in response to commands received by the module. The master die may be configured to keep its voltage blocks enabled in the non-active mode (e.g., standby mode, sleep mode, and/or any other low power modes). For example, if a die is designated as a slave die and it receives a no-operation command, it may automatically disable some or all of its voltage regulators and/or pumps and rely on the master die(s) to provide the voltage control and voltage supplies. Accordingly, the module consumes less power in standby or sleep modes with voltage blocks (e.g., regulation and generation circuits) of only the master die(s) enabled.

Accordingly, the module consumes less power in standby or sleep modes with voltage blocks (e.g., regulation and generation circuits) of the master die(s) enabled and some or all of the slave die voltage blocks disabled. In certain embodiments, the master and slave dies are structurally identical apart from any differences caused by designation as master and slave dies and manufacturing variation amongst the dies. Accordingly, when the group (e.g., module) is in a non-active mode, the master die can have its voltage blocks enabled, whereas at least some corresponding voltage blocks of slave die(s) are disabled.

In some embodiments, the master die(s) may provide one or more power supplies to the slave dies. For example, in the non-active mode, one or more of the master die(s) may have one or more of their voltage blocks being enabled and the slave dies(s) may have disabled voltage blocks. The enabled voltage blocks of the master die may supply voltages to slave dies that have voltage blocks disabled for certain operations while the slave dies, or the module, remains in a non-active mode.

In some embodiments, the master die(s) may provide refresh timing signals to the slave die(s) in response to external self-refresh command(s). In some embodiments, the refresh timing signals may enable the voltage blocks of the slave die(s). In some embodiments, the self-refresh timing signals may accompany self-refresh related power supplies to execute self-refresh of slave die(s).

FIG. 1 is a schematic diagram of a group of devices organized in a module 2, including first to fifth semiconductor devices 4a-4e. Each of devices 4a-4e may represent a semiconductor die. It should be understood that the module can include any suitable number of semiconductor devices. Thus, although illustrated in the context of five devices, more or fewer devices can be included in the module 2. Furthermore, although not depicted in FIG. 2, other circuitry, such as additional die(s), surface mount component(s), and/or integrated passive device(s) can be included. The outer dashed box of the module 2 of FIG. 1 can represent a substrate (for instance, a laminate) to which the semiconductor devices are directly or indirectly fixed.

The module 2 can be commonly packaged, with or without other devices (e.g., processor dies). In some embodiments, the semiconductor devices 4a-4e can comprise memory dies (e.g., dynamic random-access memories (DRAM), static random-access memories (SRAM), flash memories, etc.) and the module 2 can define a memory module. The module can include signal interconnect 6, supply sharing line 7, and external interconnect 8. The signal interconnect 6 and the supply sharing line 7 may be decoupled from slave dies in certain operations. In some embodiments, the signal interconnect may be omitted, such as embodiments where external (e.g., from a processor/controller) and/or internal slave commands execute enabling and disabling of voltage blocks.

While illustrated schematically with certain relationships to the various blocks of the devices 4a-4e, the skilled artisan will appreciate that the lines 6-8 can communicate directly or indirectly to any of the circuit blocks within the devices 4a-4e, and each of the illustrated lines 6-8 can represent multiple lines or pins for each of the devices 4a-4e.

The first to fifth semiconductor devices 4a-4e can include first through fifth control circuits 10a-10e, respectively. One or more of the control circuits 10a-10e are capable of transmitting control signals (e.g., operation commands, enabling signals and disabling signals for regulators and or charge pump) to other blocks of the same device and/or to other semiconductor devices. Each of the first to fifth semiconductor devices 4a-4e can include one or more voltage blocks 11a-11e. In some embodiments, the control circuit 10a-10e of each device 4a-4e can be capable of communicating control signals to the voltage blocks 11a-11e of the same die, and may also be capable of communicating signals with the other devices, for example, along the signal interconnect 6.

The power circuits 10a-10e are thus each capable of enabling a disabled voltage block 11a-11e and/or disabling an enabled voltage block 11a-11e. In some embodiments, the signal interconnect 6 may include multiple lines (for instance, a multi-bit bus) for sending the control signals. The supply sharing line 7 may be coupled to the output from the voltage blocks 11a-11e. The supply sharing line 7 may include multiple conductive lines for, for example, regulated VDD, VPP (for instance, an auxiliary supply for wordline boost of a memory) and back bias voltages (for biasing bodies of field-effect transistors or FETs), and can supply voltages from the master die to the slave dies for operations in non-active mode when corresponding slave voltage blocks are disabled.

As described in more detail below, in operation one of the semiconductor devices 4a-4e can be designated as the master die. In some embodiments, enabling/disabling voltage blocks 11a-11e of designated slave dies may be controlled by command decoders of the slave dies, optionally in combination with external signals (e.g., from a central control processor), without communication with the designated master die. In other embodiments, control over enabling/disabling of slave voltage blocks is handled by the master die control circuits. The external interconnect 8 can be used for supplying power and signals to the semiconductor devices 4a-4e of the module 2 from an external power source and processor.

In some embodiments, the voltage blocks 11a-11e can be, for example, voltage regulators and/or charge pumps that regulate the voltage distribution internally. While represented for purposes of illustration by a single block for each device, the skilled artisan will understand that the internal voltage blocks 11a-11e can each represent multiple different circuits for regulating different voltages employed internally by operational circuits.

For example, as will be appreciated by the skilled artisan, a memory die complying with the DDR4 SDRAM standards may employ ground, VDD/VDDQ (e.g., 1.2 V±60 mV), VCC2 and VPP (e.g., (e.g., 2.5 V−125 mV or +250 mV) signals for various memory operations, of which VPP may be regulated to a lower or higher internal VPP voltage than that supplied to the chip. Similarly, VDD may be used to generate one or more internal VDD levels, for instance, by internal voltage regulation. These internal VDD levels may be used to supply voltages to memory arrays, sense amplifiers (amps), and/or periphery circuits. In addition or alternatively, an internally generated VDD level may be used as part of the regulation of other supply voltages such as VPP internal.

The voltage blocks 11a-11e can be connected to other semiconductor devices 4a-4e through the interconnect 7. The semiconductor devices 4a-4e also include operational circuits, such as memory circuits 12a-12e. The skilled artisan will appreciate that memory circuits 12a-12e can include logic circuits (for instance, digital CMOS logic), which tend to employ higher voltages, as well as memory arrays and sense amplifiers, which tend to employ relatively lower voltages, and wordline voltages which may be held at around 2-3 times higher than the sense amplifier voltages.

In the semiconductor device 4a, in active modes, the voltage block 11a can provide internal supply voltage(s) to a first memory circuit 12a. Similarly, in semiconductor devices 4b-4e, the voltage blocks 11b-11e can provide internal supply voltage(s) to second to fifth memory circuits 12b-12e, respectively. It will be understood that there may be other voltage blocks (not shown) in each semiconductor device, some of which may be enabled in both active and non-active modes. For purposes of illustration, only those voltage blocks are shown that are disabled in non-active modes.

In some embodiments, one of the semiconductor devices 4a-4e, for example the semiconductor device 4a, can be designated as a master die for purposes of enabling/disabling voltage blocks (or portions thereof) in the module through the signal interconnect 6 and/or providing power supplies to other devices 4b-4e through the supply sharing line 7. The rest of or a subset of the rest of the semiconductor devices 4b-4e can be slave dies.

In some embodiments, a given module may include multiple master devices, each with one or more slave devices. In some embodiments, the master device can be selected at a hardware level. For example, fuses and/or antifuses can be included in the module 2 to hardwire designation of the master device, either at the manufacturer or customer end. In some embodiments, the fuses and/or antifuses may be programmable either during assembly or testing. For example the configuration could be reprogrammed during testing so that different configurations (e.g., the number of master dies in a stack) can be set based on the market and associated specifications for the module. In other embodiments, the master device can be selected by a software setting. For example, a die designator can set the master device according to a setting in a mode register, which can programmed by way of a chip interface or bus. Settings in the mode register can be changed by a user.

In some embodiments, each die can be shipped with a default condition as a slave die, particularly where the batch of dies are primarily to be interconnected in groups (e.g., stacked). In other embodiments, each die can be shipped with a default condition as a master die, particularly where the batch of dies are primarily to be used without direct interconnections (e.g., non-stacked) and only the minority of the dies will be interconnected (e.g., stacked). As noted elsewhere herein, devices or dies are considered identical for the purposes of the present disclosure when they are manufactured by the same process and differ only by designation as master or slave, whether by software or hardware designation. Of course different data storage on the different dies is not considered to alter their status as identical.

During operation, the module 2 can have a first condition (e.g., a non-active mode) and a second condition (e.g., an active mode). During the first condition voltage block(s) of the master device(s) can be enabled and one or more corresponding voltage block(s) of the slave device(s) can be disabled. For example, when the semiconductor device 4a is designated as the master device, only the first voltage block 11a can be enabled while the second to fifth voltage blocks 11b-11e are disabled in the first condition.

Disabling a voltage block can entail disabling any portion of the voltage block. For example, a voltage block is considered disabled when one or more regulators, one or more voltage generation circuits such a charge pumps, or a combination of regulators and voltage generation circuits of the voltage block is disabled. Disabled circuits reduce their power consumption, thus, disabled voltage blocks consume less power than enabled voltage blocks in a non-active (e.g., sleep or standby) mode. For example, static power dissipation and transistor leakage current can be reduced in the non-active mode.

Conventionally, sleep or standby modes include disabling some voltage blocks, but other voltage blocks in the sleeping or standby chip remain active in order to be able to handle certain functions during the non-active mode, such as refreshing. However, in accordance with some embodiments, a greater number and/or different types of voltage blocks in the slave dies may be disabled in non-active mode, compared to conventional sleep or standby modes, because those functions can be facilitated by voltage supplies (above, below or more stable than the externally supplied voltages along external line 8) from the master die 4a in non-active modes.

In the second condition, all of or a subset of the devices 4a-4e can be enabled. During the first condition, in some embodiments, one or more of the voltage blocks 11a-11e or one or more disabled portions of the voltage blocks 11b-11e may be controlled to be enabled. In various embodiments, the slave devices 4b-4e may receive an operational amplifier control signal from the respective control circuits 10b-10e or the first control circuit 10a. For instance, the operational amplifier control signal can be used to enable a voltage regulator that includes an operational amplifier (for instance, a low dropout regulator or LDO). It can be beneficial to disable one or more of the voltage blocks 11b-11e in the first condition, because the voltage blocks 11b-11e tend to draw current and consume power in non-active modes like standby mode, and disabling the slave voltage blocks 11b-11e when the module 2 is in non-active modes can reduce the power consumption.

In various embodiments, the first voltage block 11a of the master device 4a may supply power to the slave memory circuits 12b-12e when, for example, one or more of the slave memory circuits 12b-12e call for a current load to maintain a voltage level that exceeds a first threshold load value. The first threshold load value may vary depending at least in part on the voltage supply from voltage blocks (not shown) of the slave dies 4b-4c that remain enabled in non-active mode that may provide power in the non-active mode.

In some embodiments, when all voltage blocks of a slave device are disabled, the first threshold value may be zero. As a simpler example, under the non-active mode, when the second memory circuit 12b calls for a current load level that is below the first threshold value, the enabled voltage block(s) (not shown) of the slave die 4b may provide internally generated supply to the second memory circuit 12b. Under the non-active mode, when the second memory circuit 12b calls for a current load value that is between the first threshold value and a second threshold value, the master voltage block 11a may provide power supply to the second memory circuit 12b. The second threshold value can be the current level that the master voltage block 11a can provide to the second memory circuit 12b. When the second memory circuit 12b calls for a current load value that exceeds the second threshold value, the second voltage block 11b may be enabled, which makes the second device 4b in the active mode. It will be understood that any one or more semiconductor devices 4a-4e can be designated as master device(s).

The semiconductor devices 4a-4e of FIG. 1 can thus be structurally identical devices. In some embodiments, having identical semiconductor devices in the module 2 can be beneficial. For example, from a manufacturing point of view, it is more cost efficient to manufacture identical dies than manufacturing different ones. Also, it can be easier to organize inventory of the devices, and in case of failure of one device in a module, another device can be designated as the master. However, in some embodiments, the devices or dies in the module can comprise different devices, for example with a master device manufactured to have a different configuration from slave devices.

In some embodiments, a refresh command can trigger the voltage blocks 11b-11e of the slave semiconductor devices 4b-4e to be enabled. In some embodiments, the refresh command can enable portions of or entire voltage blocks 11b-11e. In some embodiments, a bank activate command can trigger the voltage blocks 11b-11e of the slave semiconductors 4b-4e to be enabled. In some embodiments, a read command can trigger the voltage blocks 11b-11e of the slave semiconductors 4b-4e to be enabled. In some embodiments, a write command can trigger the voltage blocks 11b-11e of the slave semiconductors 4b-4e to be enabled. In some embodiments, a pre-charge command can trigger the voltage blocks 11b-11e of the slave semiconductors 4b-4e to be enabled. However, one or more of these commands may not trigger the voltage blocks 11b-11e of the slave devices 4b-4e to be enabled when, for example, an externally supplied voltage is sufficiently stable and at a suitable level to conduct such commands, and/or such commands call for a current load value below the first threshold value.

The supply sharing line 7 that can be electrically coupled to the voltage blocks 11a-11e may carry reference voltage supplies and generated and/or regulated power supply voltages. When a voltage block is disabled, the disabled voltage block may be electrically decoupled from the supply sharing line 7 such that from the perspective of supply sharing line 7, the voltage block is a high impedance node. The master device voltage block 11a may actively drive the supply sharing line 7.

In some embodiments, the voltage blocks 11a-11e can include internal power supplies such as linear voltage regulators that generate and provide regulated voltage to the memory circuits 12a-12e. For example, the voltage blocks 11a-11e can comprise low dropout (LDO) voltage regulators. In some embodiments, the voltage blocks 11a-11e can include one or more voltage modification circuits, such as charge pumps that provide elevated or reduced voltages to other circuits in the dies relative to that generated by either an external or internal power supply, as described below with respect to FIG. 2. For example, the voltage blocks 11a-11e can include both a linear voltage regulator and a charge pump that receives regulated voltage from the linear voltage regulator and outputs a pump voltage.

In some embodiments, the voltage blocks 11a-11e can each include multiple voltage generators or voltage regulators, such as, for example, a voltage regulator for VPP and a voltage regulator for VBB. In some embodiments, the voltage block 11a-11e may include a voltage generator that comprises at least one of a power consuming oscillators, charge pump circuitries, and/or operational amplifiers (for instance, for providing negative feedback in an LDO regulator).

In some embodiments, the voltage block 11a-11e may include a reference circuits that may produce a constant voltage irrespective of the loading on the device, power supply variations, temperature changes and/or passage of time. The reference circuits may comprise at least one of power consuming operational amplifiers, voltage dividers, current mirrors, and/or band gap circuits. Furthermore, in some embodiments, a regulated supply such as VDD internal may be used to regulate the voltage of a different regulated supply such as VPP, VBB or V bitline precharge.

Figure 2:
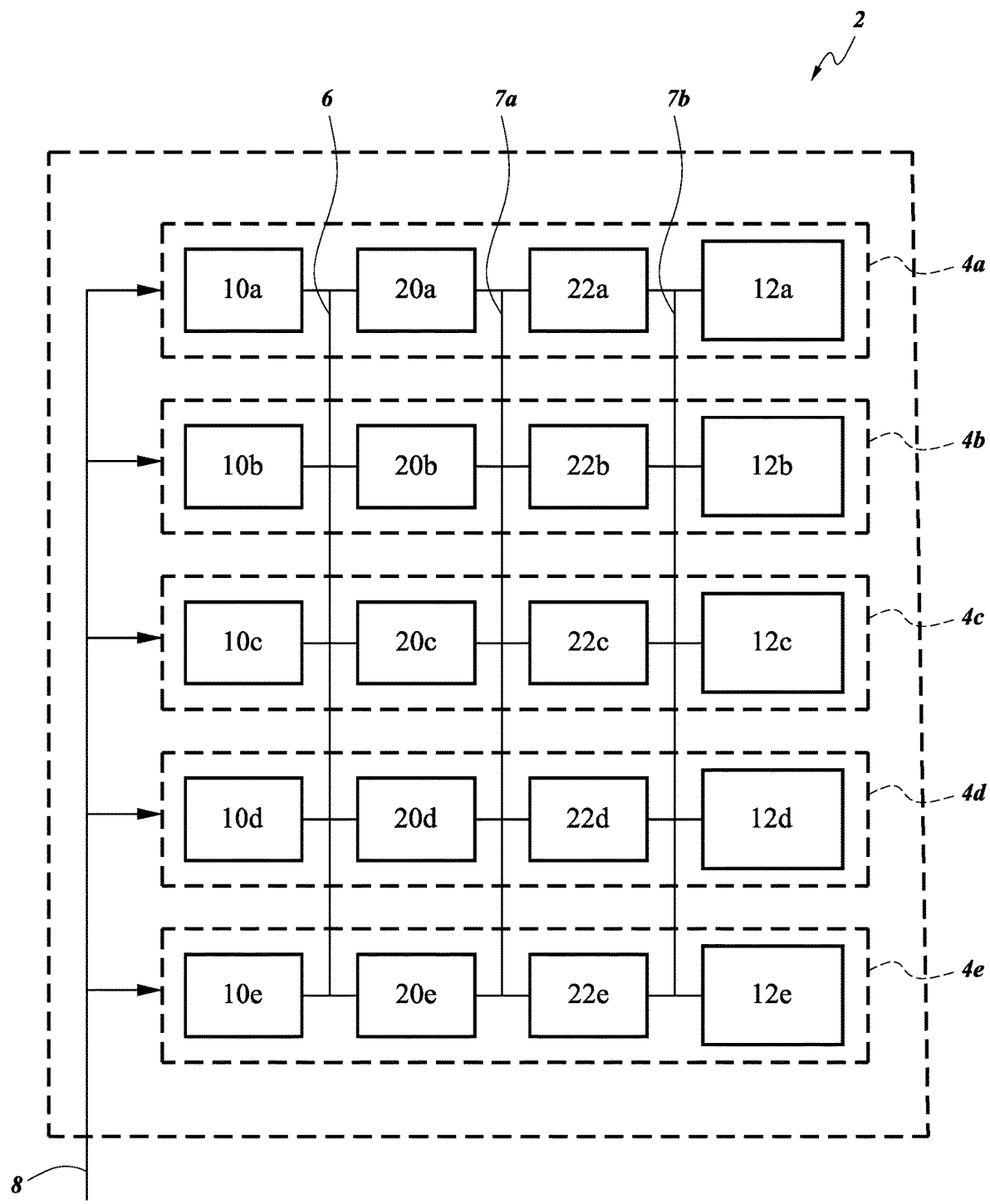
FIG. 2 is a schematic diagram of a module including first to fifth semiconductor devices, according to one embodiment.

FIG. 2 is a schematic diagram of a module 2 including first to fifth semiconductor devices 4a-4e. Each of the first to fifth semiconductor devices 4a-4e includes a power control circuit 10a-10e, a voltage block that includes a linear voltage regulator 20a-20e, and a charge pump 22a-22e. For example, the linear voltage regulators 20a-20e maybe low dropout (LDO) regulators or other common forms of internal power supply regulation circuits.

Unless otherwise noted, components of FIG. 2 are the same as or generally similar to like-numbered components shown in FIG. 1. It should be understood that the module 2 can include any suitable number of semiconductor devices. In some embodiments, the semiconductor devices 4a-4e can comprise memory dies (such as dynamic random-access memories (DRAM), static random-access memories (SRAM), flash memories, etc.) and the module 2 can define a memory module.

The module can include signal interconnect 6, first and second supply sharing lines 7a, 7b and external interconnect 8. In some embodiments, the signal interconnect 6 may include one or more coupling lines to individually control one or more of the voltage regulators 20a-20e and/or the charge pumps 22a-22e as desired. The coupling lines that comprise signal interconnect 6 may carry signals that include commands, such as precharge, bank activate, refresh, etc., and/or signals that address information indicating the die or dies being addressed. The signals may result from external commands to the module via external interconnect 8. The external interconnect 8 can be used for supplying power to the first to fifth semiconductor devices 4a-4e from an external power supply.

Regulated voltages generated at the linear voltage regulators 20a-20e may couple to the first supply sharing line 7a and couple to the charge pumps 22a-22e and/or the memory circuits 12a-12e, depending upon the current load level called for. First to fifth charge pumps 22a-22e can receive regulated voltage from the linear voltage regulators 20a-20e and generate and provide modified voltages to the memory circuits 12a-12e, in some embodiments. However, in some other embodiments, the charge pumps 22a-22e can receive a voltage set by an external power supply directly and generate and provide pump voltage to the memory circuits 12a-12e. In some embodiments, the modified voltages generated in one or more of the charge pumps 22-22e may be shared to other devices in the module 2 through the second supply sharing line 7b. Thus, in some embodiments, the internal linear voltage regulators can be omitted.

In semiconductor device 4a, the linear voltage regulator 20a can provide regulated voltage to the first charge pump 22a and/or the first memory circuit 12a. The first charge pump 22a can provide a pumped voltage to the first memory circuit 12a. Similarly, in semiconductor devices 4b-4e, the linear voltage regulators 20b-20e can provide second to fifth regulated voltages to the second to fifth charge pumps 22b-22e, respectively, and/or to the second to fifth memory circuits 12b-12e, respectively. The second to fifth charge pumps 22b-22e can provide a pumped voltage to the second to fifth memory circuits 12b-12e, respectively.

For example, in an embodiment where the semiconductor device 4a is designated as a master device for the module 2, the linear voltage regulator 20a and/or the charge pump 22a can be enabled while the linear voltage regulators 20b-20e and/or the charge pumps 22b-22e are disabled in the first condition (for example, non-active mode). In transition from the first condition to the second condition (for example, active mode), in some embodiments, enabling or activation signals from the power control circuits 10b-10e may be sent to enable one or more of the linear voltage regulators 20b-20e, respectively, and/or the charge pumps 22b-22e, respectively. The linear voltage regulators 20a and/or the charge pump 22a of the master device 4a can remain active in the first condition (e.g., non-active mode). It can be beneficial to disable one or more of the voltage regulators 20b-20e and/or the charge pumps 22b-22e in the first condition (e.g., when the entire module 2 is in non-active mode, or when executing a command that does not significantly place a load on an internally generated supply of the master device 4a). Disabling one or more of the linear voltage regulators 20b-20e and/or the charge pumps 22b-22e (independently or together) during such condition can reduce the current consumption. It should be understood that any one or more semiconductor devices 4a-4e can be designated as a master device, and there may be more than one designated master device within a module in some embodiments.

In some embodiments, all slave linear voltage regulators 20b-20e may be disabled and the master linear voltage regulator 20a can control charge pumps 22a-22e. In such embodiments, the voltage regulator 20b-20e may be decoupled from the charge pumps 22b-22e, and the master linear voltage regulator 20a and the charge pumps 22b-22e are electrically coupled via the first supply sharing line 7a.

Figure 3A:
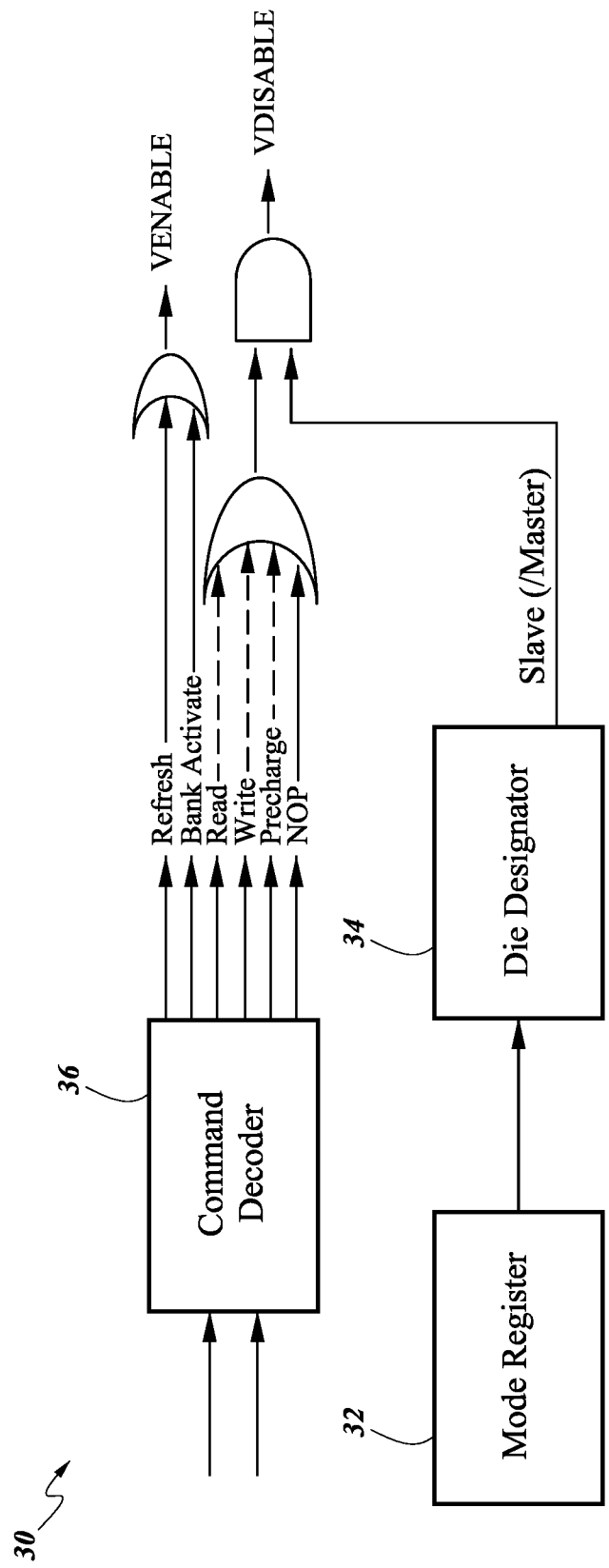
FIG. 3A is a diagram showing a system included in a module similar to those illustrated in FIGS. 1-2 in one embodiment.

FIG. 3A is a diagram showing a system 30 included in a module similar to those illustrated in FIGS. 1-2 in one embodiment. The system 30 may reside within each of the control circuits 10a-10e of the semiconductor devices 4a-4e, respectively.

The system 30 includes a mode register 32, a die designator 34, and a command decoder 36 included in each device. For convenience, reference will be made to the components of FIG. 1. As illustrated in FIG. 3A, for example, the mode register 32 can include a die designator 34 to designate the semiconductor devices 4a-4e in the module 2 as master or slave devices.

In FIG. 3A, it is shown that the die designator 34 outputting a logic level 1 that designates the device as the slave device and the voltage block of the device can be disabled in standby mode. Therefore, the output of the AND gate is labeled VDISABLE in the system 30 illustrated in FIG. 3A. On the other hand, if the die designator 34 outputs a logic level 0, the device is designated as a master device and its voltage block remains enabled as a default. Although an example of various logic levels has been described, other implementations are possible, such as configurations using opposite or inverted logic.

Settings in the mode register 32 can be modified by a user (for instance, by way of an interface or bus). In some embodiments, the mode register and the die designator can be omitted where master/slave selection occurs at a hardware level. For example, fuses and/or antifuses can be included in the module to set the master device, or only the master device(s) may include control(s) circuit that can transmit signals to enable/disable slave device(s). As used herein, reference to structurally "identical" dies includes dies that are initially identical and only modified by designation, whether through software alone or through hardware changes such as fuse or antifuse modification. The voltage blocks can include internal power supplies, such as, for example, linear voltage regulators (such as LDO voltage regulators), and/or voltage modifiers (such as charge pumps).

In the system 30, commands from the command decoder 36 can cause the master device to enable or disable the voltage blocks in the device. For example, when the command decoder 36 receives a signal to execute a refresh command in the device, the command decoder 36 can enable the voltage block of the device. For example, when the command decoder 36 of a device receives a signal to execute a bank activate command, the command decoder 36 can enable the relevant voltage block(s) of that device. Therefore, the output of the OR gate is labeled VENABLE in the system 30 illustrated in FIG. 3A. When the command decoder 36 of a device receives a signal to execute a read command, the command decoder 36 can enable the relevant voltage block(s) that device. When the command decoder 36 of a device receives a signal to execute a write command, the command decoder 36 can enable the relevant voltage block(s) of that device. When the command decoder 36 of a device receives a signal to execute a pre-charge command, the command decoder 36 can enable the relevant voltage block(s) of that device.

However, one or more of these commands may not enable the voltage regulators of the slave devices under certain conditions. For example, the voltage regulator of the slave device that is in a non-active mode may remain disabled when an externally supplied voltage and/or internal supplies regulated/generated in the master device can be used to conduct such commands. For example, as indicated in FIG. 3A, the read, write, pre-charge and non-operation (NOP) command(s) may not enable the voltage regulator when stability of the supply is sufficient to maintain product performance under the current load associated with the command(s) or when the regulated supply is provided externally.

Figure 3B:
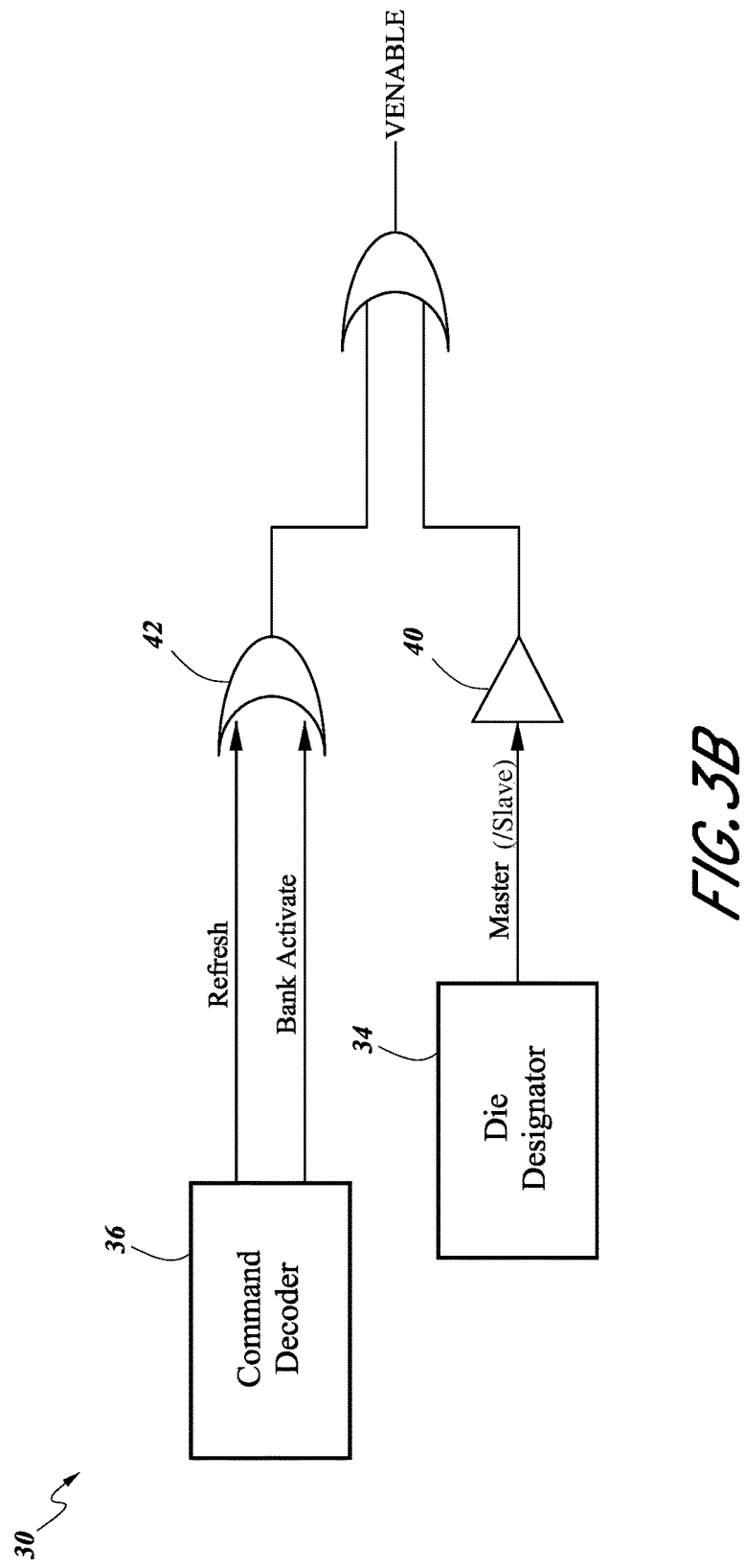
FIG. 3B is a diagram showing a system included in a module similar to those illustrated in FIGS. 1-2 in one embodiment.

FIG. 3B is a diagram showing a system 30 included in a module similar to those illustrated in FIGS. 1-2 in one embodiment. The system 30 may reside within each of the control circuits 10*a*-10*e* of the semiconductor devices 4*a*-4*e*. The die designator 34 included in a device designates the device as a master or a slave device. When the device is designated as the master device, the die designator 34 sends a designation signal as a logic "1" to a first logic gate (e.g., a buffer gate 40) and a voltage block included in the device may be enabled as a default setting. Therefore, the output of the OR gate is labeled VENABLE in the system 30 illustrated in FIG. 3B. When the device is designated as the slave device, the die designator 34 sends a designation signal as a logic "0" to a first logic gate (e.g., a buffer gate 40) and the voltage block included in the device may be disabled in non-active modes.

In the system 30 illustrated in FIG. 3B, the command decoder 36 included in a slave device may send enabling signals to a second logic gate (e.g., OR gate 42) to enable a disabled voltage block. The system 30 of FIG. 3B includes defaults such that the command decoder 36 of a designated slave device does not rely on disabling signals, and instead defaults to keeping the relevant voltage block(s) disabled in a non-active mode in the absence of selected commands (such as "refresh" and "bank activate" as illustrated) that call for enablement, which may simplify the structure of the system 30. In the non-active mode, designated slave devices can be configured to respond only to the selected commands, which can temporarily enable the relevant voltage block(s) for accomplishing these functions.

Figure 3C:
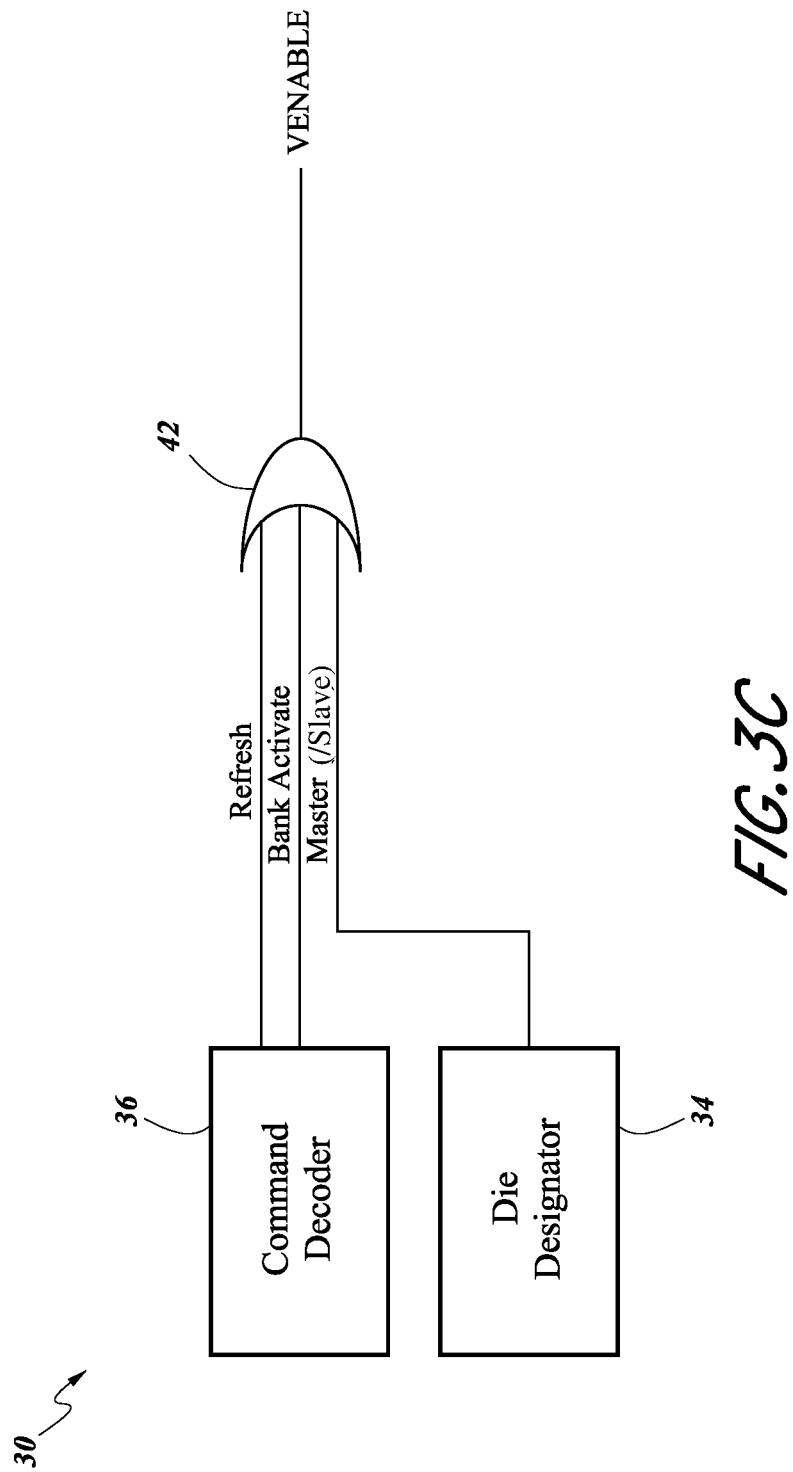
FIG. 3C is a diagram showing a system included in a module similar to those illustrated in FIGS. 1-2 in one embodiment.

FIG. 3C is a diagram showing a system 30 included in a module similar to those illustrated in FIGS. 1-2 in one embodiment. The system 30 may reside within each of the control circuits 10*a*-10*e* of the semiconductor devices 4*a*-4*e*. In the system 30 illustrated in FIG. 3C, unlike the system 30 of FIG. 3B, the die designator 34 sends a designation signal to the OR logic gate 42 omitting the buffer gate 40 present in FIG. 3C, which may simplify the structure of the system 30. When the device is the master device, the die designator 34 may output 1, thereby enabling the voltage block in the device. When the device is a slave device, the die designator outputs 0, such that without any 1 output from the command decoder, the relevant voltage block(s) is/are by default disabled. Similar to the embodiment of FIG. 3B, in a non-active mode, designated slave devices can be configured to respond only to selected commands (such as "refresh" and "bank activate" as illustrated), which can temporarily enable the relevant voltage block(s) for accomplishing these functions. Therefore, the output of the OR logic gate 42 is labeled VENABLE in the system 30 illustrated in FIG. 3C.

Figure 4:
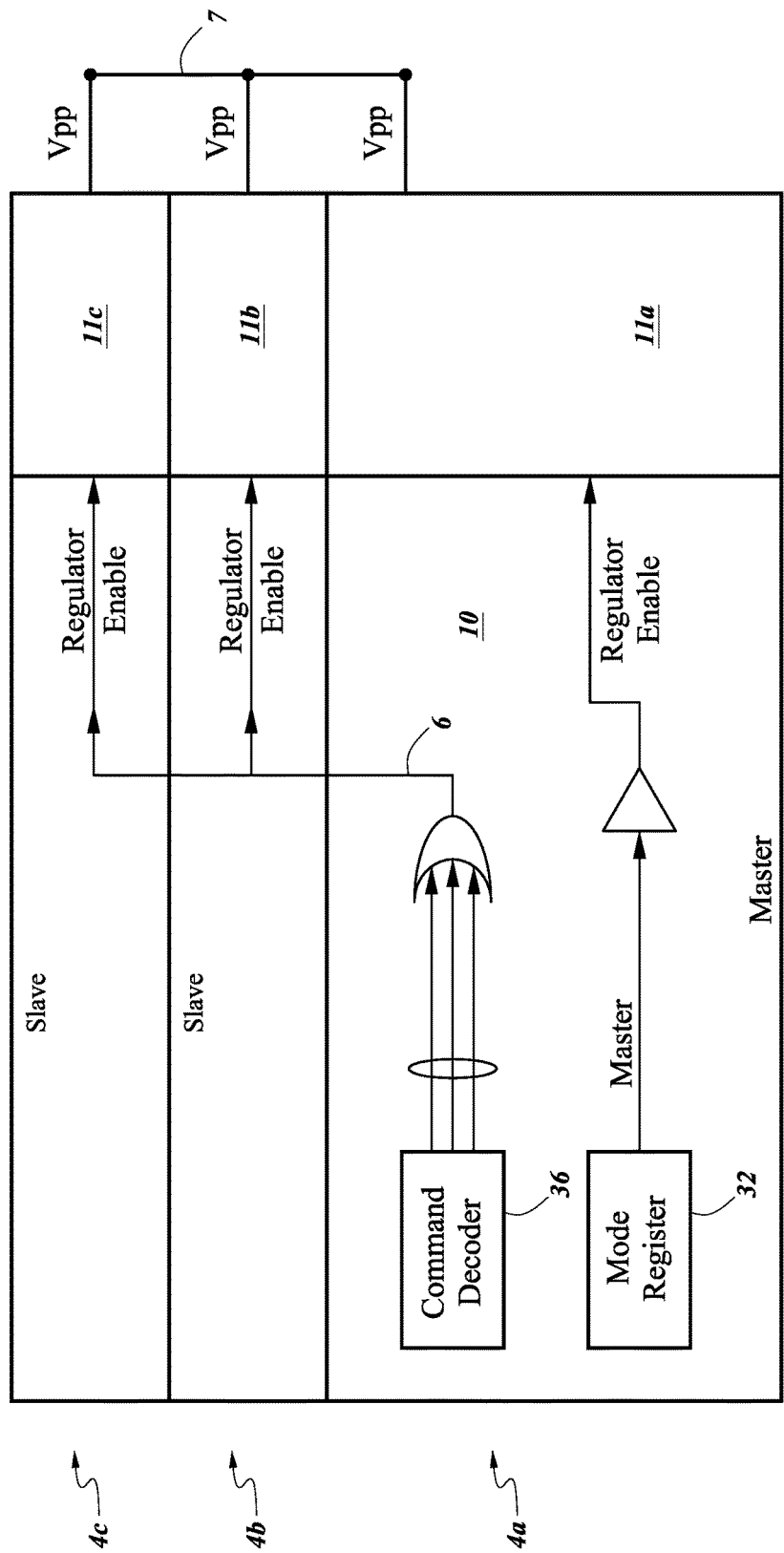
FIG. 4 is a diagram showing a system included in a module similar to those illustrated in FIGS. 1 and 2.

FIG. 4 is a diagram showing a system 31 included in a module similar to those illustrated in FIGS. 1 and 2. It should be understood that even though FIG. 4 shows the system 31 with three devices 4*a*-4*c*, the module may include any number of devices. For example, the module may include five devices with one device similar to the first device 4*a* and four identical devices similar to the second or the third device 4*b*, 4*c*.

The first die 4*a* may include a mode register 32 that designates the first device as a master device, and a command decoder 36 that can send enabling/disabling signals to other devices 4*b*, 4*c*. A voltage block 11*a* included in the master device 4*a* can be enabled as a default. The enabling/disabling signals can be sent through a signal interconnect 6. The voltage blocks 11*b*, 11*c* of the slave devices 4*b*, 4*c*, can enable/disable by the enabling/disabling signals from the command decoder 36. For example, the voltage blocks 11*b*, 11*c* of the slave devices 4*b*, 4*c* can be disabled as a default in a first condition (e.g., non-active mode), and when a high power command (e.g., a command that calls for a current load value that is greater than a threshold value), the command decoder 36 may send enabling signals through the signal interconnect 6 to enable one or more of the slave voltage blocks 11*b*, 11*c*.

In some embodiments, in a low power or non-active mode, when a command calls for a current load level that is equal to or lower than the threshold value, power supplies for the slave devices 4*b*, 4*c* may come from enabled portions of the respective disabled voltage blocks 11*b*, 11*c* and/or the corresponding master voltage block 11*a* through a supply sharing line 7 to provide to power consuming circuitries (e.g., memory circuits 12*b*, 12*c*).

Figure 5A:
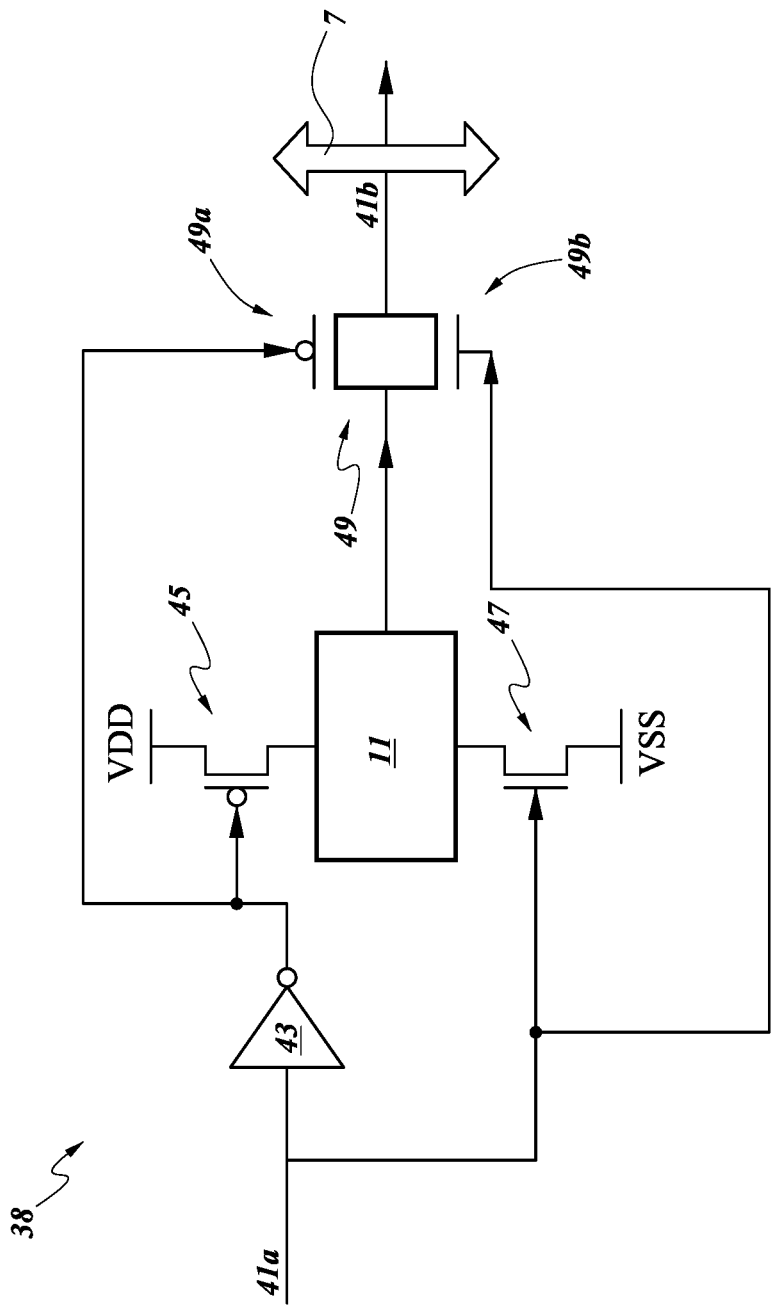
FIG. 5A shows a circuit of a device included in a module according to one embodiment.

FIG. 5A shows a circuit 38 of a device included in the module 2. Such a circuit 38 may be provided in each of the devices 4*a*-4*e*, which have identical structures in embodiments. The circuit 38 includes an input line 41*a*, an output line 41*b*, a NOT gate 43 (also referred to as an inverter), a PMOS transistor 45, an NMOS transistor 47, a transmission gate 49, and a voltage block 11. The transmission gate 49 can comprise a first transistor 49*a* and a second transistor 49*b*, in some embodiments.

In some embodiments, the circuit 38 may be connected to other devices that are included in the module 2 via the supply sharing line 7. For example, when the device is designated as a master, an input signal on the input line 41*a* may default as a logic "1". The NOT gate 43 receives the signal as 1 and outputs a gate output as 0. The PMOS transistor 45 receives the gate output at its gate turning the PMOS transistor 45 on. The gate output is also received at gate of the first transistor 49*a*, turning the transistor 49*a* on. The enable signal can be received at gate of the NMOS transistor 47 turning the NMOS transistor 47 on. The enable signal can also be received at gate of the second transistor 49*b*, turning the transistor 49*b* on.

Therefore, the voltage block 11 may generate supply and output the supply at the output line 41*b*. The generated supply may be sent to other devices in the module 2 via the supply sharing line 7.

When an input signal is received at the input line 41*a* corresponding to a slave device entering a non-active mode, the NOT gate 43 receives the signal as 0 and outputs a gate output as 1. The PMOS transistor 45 receives the gate output at its gate turning the PMOS transistor 45 off. The gate output is also received at gate of the first transistor 49*a*, turning the first transistor 49*a* off. The input signal can be received at gate of the NMOS transistor 47 turning the NMOS transistor 47 off. The input signal can also be received at gate of the second transistor 49*b*, turning the second transistor 49*b* off. Therefore, the voltage block 11 is disabled. The transmission gate 49 may electrically decouple the voltage block 11 from what is connected downstream of the voltage block 11 such that a high impedance node is created when the input signal is received at the input line 41*a*.

In some embodiments, when an enable signal is received at the input line 41*a* as the input signal corresponding to a slave device entering an active mode, the circuits can behave in a manner similar to a master device and voltage block 11 may be enabled. In such embodiments, the output line 41*b* can be coupled to the supply sharing line 7.

In some embodiments, an external supply may be provided at source of the PMOS transistor 45. In some embodiments, a ground connection (e.g., a floating ground connection, etc.) may be provided at source of the NMOS transistor 47. In some embodiments, a positive voltage supply VDD may be provided at the source of the PMOS 45 and a negative voltage supply VSS may be provided at the source of the NMOS transistor 47. In some embodiments, the supply sharing line 7 may carry the generated supply that may accompany a control signal.

In some embodiments, when the circuit 38 is used in a slave die, voltage block 11 may include a voltage control circuit that can be controlled by the circuit 38 included in the slave die. For example, the voltage control circuit of the slave die may be enabled and/or disabled by the circuit 38.

Figure 5B:
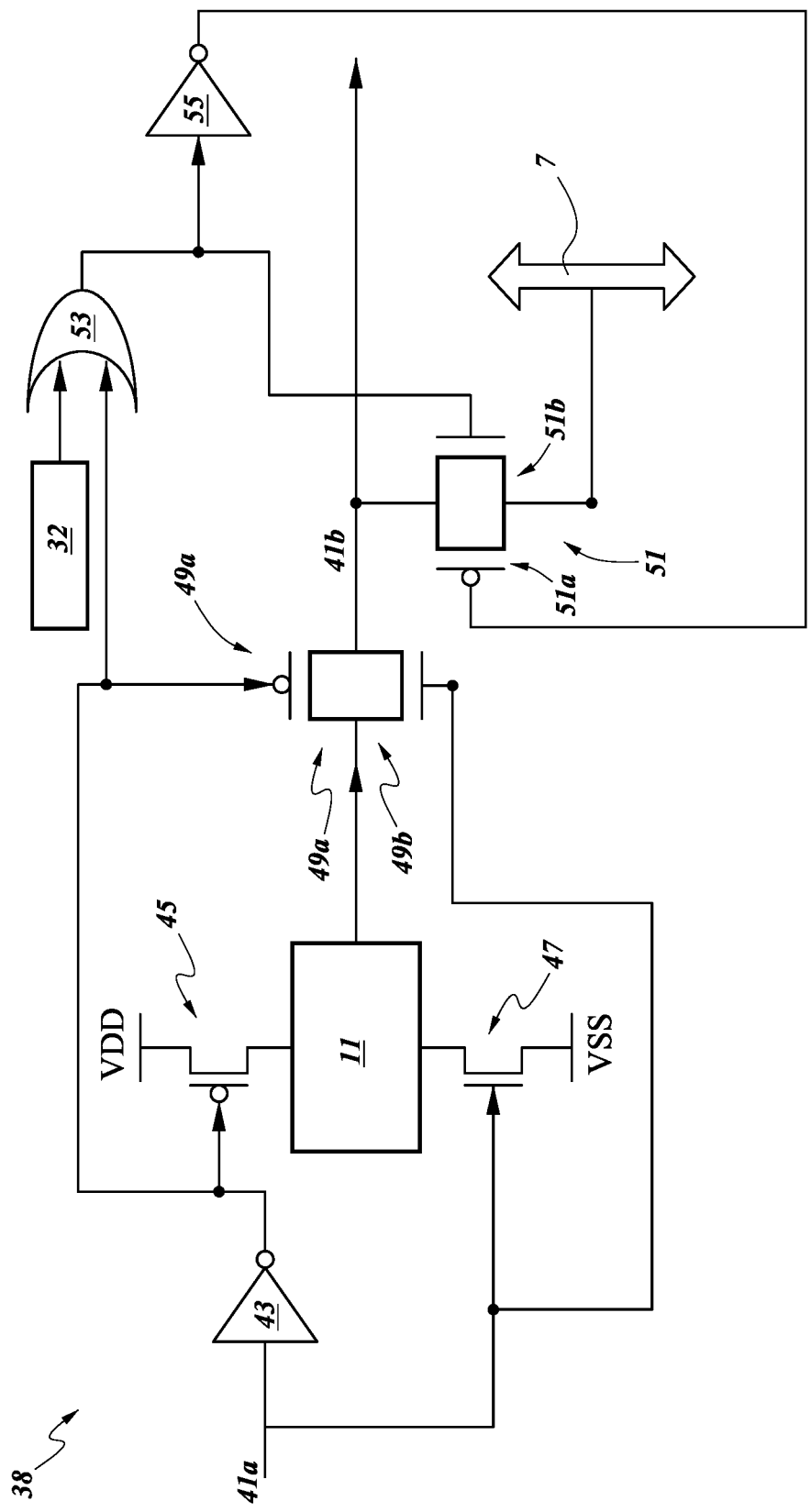
FIG. 5B shows a circuit of a device included in a module according to one embodiment.

FIG. 5B shows a circuit 38 of a device included in the module 2. Such a circuit 38 may be provided in each of the devices 4*a*-4*e*, which have identical structures in some embodiments. The circuit 38 includes an input line 41*a*, a first output line 41*b*, a first NOT gate 43, a second NOT gate 55, a PMOS transistor 45, an NMOS transistor 47, a first transmission gate 49, a second transmission gate 51, an OR gate 53, a mode register 32, and a voltage block 11. The transmission gate 49 can comprise a first transistor 49*a* and a second transistor 49*b*, in some embodiments. The second transmission gate 51 can comprise a third transistor 51*a* and a fourth transistor 51*b*, in some embodiments.

The embodiment of FIG. 5B differs from FIG. 5A such that the output line 41*b* from the voltage block 11 may be decoupled by the second transmission gate 51 when the enable signal is received at the input line 41*a* in a slave device. For example, as explained with respect to FIG. 5A, when an enable signal is received at the input line 41*a* as the input signal, the first NOT gate 43 receives the input signal as 1, the voltage block 11 may generate supply and output the supply at the output line 41*b*, in the master device. The output supply can be provided to the device's own internal circuitry that uses the supply.

When the device is the master device, the mode register 32 included in the device can send the input signal as 1 to the OR gate 53 and the OR gate 53 may output a logic 1. The output of the OR gate 53 can be received by the second NOT gate 55, which turns on the third transistor 51*a*. The output of the OR gate 53 can also be received by the fourth transistor 51*b*, which turns in the fourth transistor 51*b*. Therefore the second transmission gate 51 may be turned on such that the output line 41*b* is electrically coupled with the supply sharing line 7 and thus, by default the master device is enabled to supply voltages to slave devices when the slave devices are coupled to the voltage sharing line 7.

On the other hand, when the device is the slave device, the mode register 32 included in the device can send a logic 0 to the OR gate 53. OR gate 53 behaves now as a buffer for the output of NOT gate 43. When the input signal received at the input line 41*a* is high for the slave device (e.g. enabling voltage block 11), the second transmission gate 51 may be turned off such that the output line 41*b* is electrically decoupled from the voltage sharing line 7 and the output line 41*b* is coupled to the output of the enabled voltage block 11. Conversely, for a slave device, when the signal received at the input line 41*a* is a logic 0, the transmission gate 51 is enabled and the output line 41*b* is coupled to the supply sharing line 7 and the output line 41*b* is decoupled from the disabled voltage block 11.

In some embodiments, the circuit 38 may be applied to the linear voltage regulators 20*a*-20*e* and/or the charge pumps 22*a*-22*e* shown in FIG. 2. When the circuit 38 is applied to the linear voltage regulators 20*a*-20*e*, the input line 41*a* may be connected to the corresponding power control circuit 10*a*-10*e*, and the output line 41*b* may be connected to the charge pump 22*a*-22*e* and the first supply sharing line 7*a*. When the circuit 38 is applied to the charge pump 22*a*-22*e*, the input line 41*a* may be connected to the linear voltage regulator 20*a*-20*e*, and the output line 41*b* may be connected to the memory circuit 12*a*-12*e* and the second supply sharing line 7*b*.

The input signal (e.g., enabling signal and disabling signal) may be provided internally within the devices. For example, disabling signal is generated in a slave device, the slave device may couple the supply sharing line 7 to demand supply from the master device. More specifically, as explained with respect to FIG. 5A, when a disable signal is received at the input line 41*a*, the NOT gate 43 receives the signal as 0, the voltage block 11 is disabled. The OR gate 53 receives an output signal as 1 from the NOT gate 43. Therefore, when the disable signal is received at the input line 41*a*, the supply sharing line 7 is electrically coupled with the output line 41*b* in both the master device and the slave device.

Figure 6A:
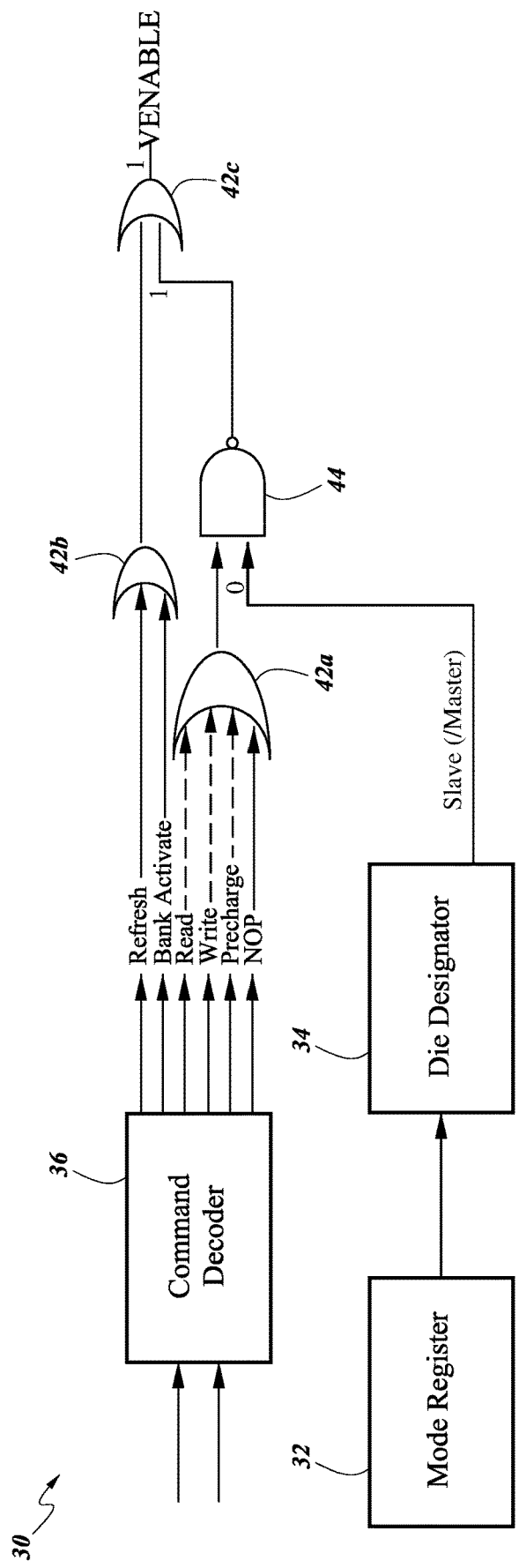
FIG. 6A illustrates the system of FIG. 3A in a device designated as a master device.
Figure 6B:
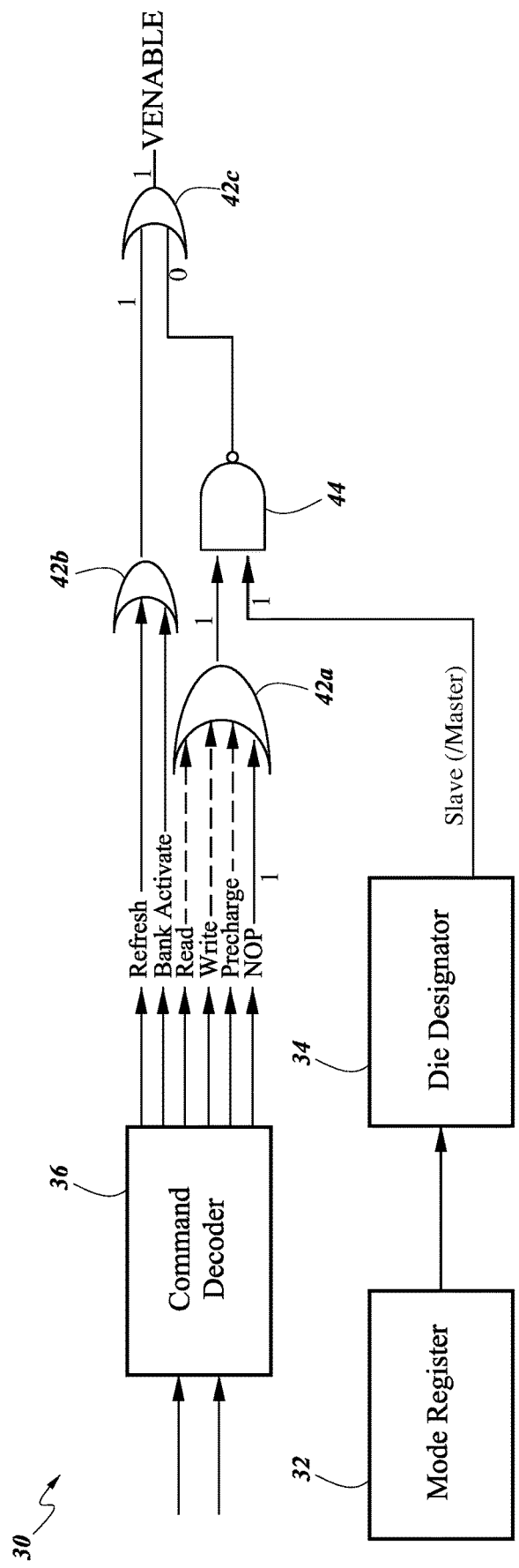
FIG. 6B illustrates the system in a slave device with an instruction of a non-operation (NOP) command from its command decoder.
Figure 6C:
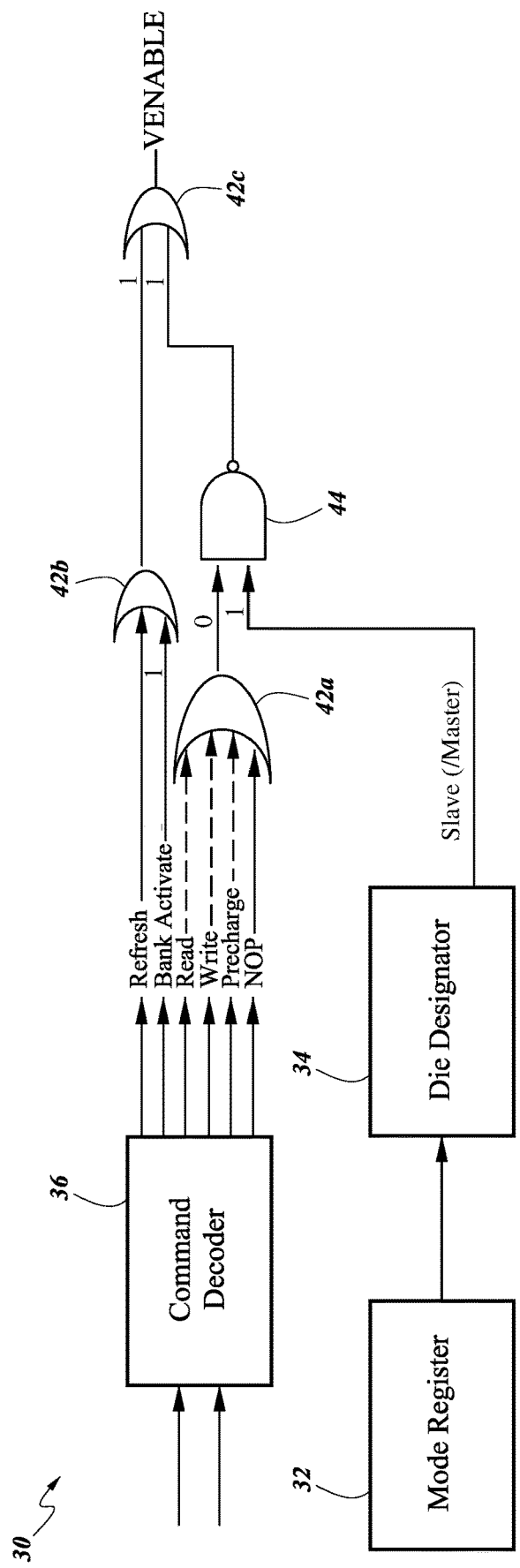
FIG. 6C illustrates the system in a slave device with an instruction of a bank activate command from its command decoder.

FIGS. 6A-6C illustrate the system 30 of FIG. 3A in various conditions. The system 30 may reside within each of the control circuits 10*a*-10*e* of the semiconductor devices 4*a*-4*e*, but FIGS. 6A-6C show the system in different conditions that are particular to slave or master designated devices in various embodiments.

In particular, FIG. 6A shows the system 30 of FIG. 3A in a device designated as a master device. FIG. 6B illustrates the system 30 in a slave device with an instruction of a non-operation (NOP) command from its command decoder 36. FIG. 6C illustrates the system 30 in a slave device with an instruction of a bank activate command from its command decoder 36. Unless otherwise noted, components of FIGS. 6A-6C are the same as or generally similar to like-numbered components shown in FIG. 3A.

Referring to FIG. 6A, the system 30 may include first to third OR gates 42a-42c, and an NAND gate 44. Because FIG. 6A represents the system 30 of the master device, the die designator 34 may send 0 to the NAND gate 44 such that an output from the NAND gate 44 is always 1 regardless of any signals received from the command decoder 36 through the first OR gate 42a. This output 1 keeps an output of the third OR gate 42c always 1, which keeps the master voltage regulator enabled as a default. Therefore, the output of the OR logic gate 42c is labeled VENABLE in the system 30 illustrated in FIG. 6A.

Referring to FIG. 6B, as with FIG. 6A, the system 30 may include the first to third OR gates 42a-42c and the NAND gate 44. Because FIG. 6B represents the system 30 of the slave device, the die designator 34 may send 1 to the NAND gate 44 such that the output from the NAND gate would be 0 when the signal received from its command decoder 36 through the first OR gate 42a is 1. When there is a NOP command, the command decoder 36 sends 1 to the first OR gate 42a, such that the output from of the first OR gate 42a is 1. Hence, the NAND gate 44 receives 1 from the die designator and another 1 from the first OR gate 42a, and outputs 0 to the third OR gate 42c. As a result, the slave voltage block is disabled unless the third OR gate receives 1 from the second OR gate 42b. As in FIG. 6A, in the illustrated embodiment of FIG. 6B, the output of the OR logic gate 42c is 1 in this operating scenario, and labeled VENABLE.

Referring to FIG. 6C, as with FIGS. 6A and 6B, the system 30 may include the first to third OR gates 42a-42c and the NAND gate 44. Because it is the system 30 of the slave device, the die designator 34 may send 1 to the NAND gate 44 such that the output from the NAND gate would be 0 when the signal received from the command decoder 36 through the first OR gate 42a is 1. When there is a bank activate command (or any other command that calls for a current load value that is higher than a threshold value), the command decoder 36 sends 0 to the first OR gate 42a and sends 1 to the second OR gate 42b. Therefore, the third OR gate 42c receives 1 from the second OR gate 42b and the NAND gate 44 and outputs 1, enabling the slave voltage block. As in FIGS. 6A and 6B, in the illustrated embodiment of FIG. 6C, the output of the OR logic gate 42c is 1 in this operating scenario, and labeled VENABLE.

FIG. 7 shows a diagram of a system 50 for a self-refresh mode (SRM) in a group of devices 4a-4c connected by signal interconnect 6. FIG. 7 is illustrated to have only three devices 4a-4c. However, in some embodiments, the system 50 can include any number of devices that may be connected by the signal interconnect 6. Each device 4a-4c can include a command decoder 36a-36c, a mode register 32a-32c, an AND gate 46a-46c, an oscillator 48a-48c, and a programmable delay generator 54a-54c.

In the illustrated embodiment of FIG. 7, the first device 4a is designated as the master device by the mode register 32a. The second and third devices 4b, 4c are designated as the slave devices by the mode registers 32b, 32c. Each command decoder 36a-36c outputs an SRM command signal as 1 to the AND gate 46a-46c. Because the mode register for the master device 4a sends 1 as the signal to the AND gate 46a, the AND gate 46a outputs an oscillator enabling signal as 1. However, for the slave devices 4b, 4c, the mode register sends 0 as the signal to the AND gates 46b, 46c, making the outputs of the AND gates 46b, 46c 0. Therefore, the first oscillator 48a is enabled and the second and third oscillators 48b, 48c are disabled. Disabling the slave oscillators 48b, 48c may be beneficial as they do not draw power. In some embodiments, the system 50 may also include switches 52a-52c between the oscillators 48a-48c and the programmable delay generators 54a-54c. In the slave devices 4b, 4c, the switches 52b, 52c may isolate the oscillators 48a-48c and the delay generators 54b, 54c. In some embodiments, the switches 52a-52c may comprise N-channel gates or any high impedance drivers.

The enabled first oscillator 48a outputs a refresh signal as 1 through the switch 52a to the delay generator 54a-54c via the interconnect 6. In some embodiments, the programmable delay generator 54b, 54c may be omitted or disabled such that the master delay generator 54a sends staggered signals to each die 4a-4c via the interconnect 6. In such embodiments, the interconnect 6 may comprise multiple lines to carry different signals to different devices. In some embodiments, the master device 4a may send the refresh signal with address information. The address information may include timing of each refresh in different devices 4a-4c.

Figure 8:
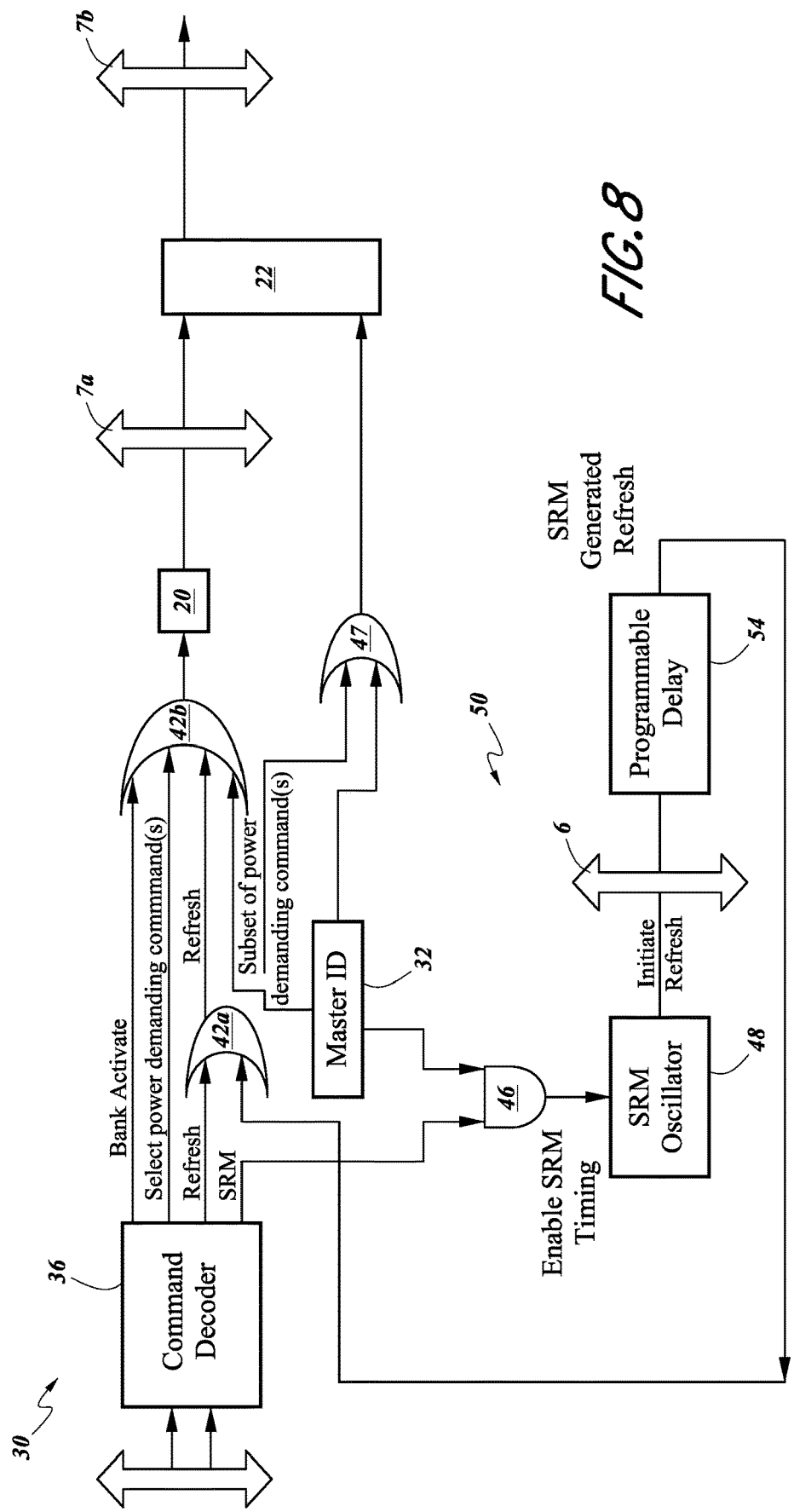
FIG. 8 schematically illustrates logic for operations in accordance with an embodiment.

FIG. 8 schematically illustrates logic for operations in accordance with an embodiment. The command decoder 36 may send command signals to a first OR gate 42a, a second OR gate 42b, and/or an AND gate 46. For example, the command decoder 36 may send a self-refresh mode (SRM) command signal to the AND gate 46. For a device designated as the master device, the SRM command may enable an SRM oscillator 48 and send a signal to a programmable delay generator 54. In some embodiments, if the device is a slave device, the oscillator can be disabled and may be decoupled from signal interconnect 6.

The programmable delay generator 54 may be initiated by an initiate refresh command originated in the master device. The programmable delay generator 54 may control timing of the self-refresh of the device and be programmed such that refresh events for the dies in the module may be deterministically set. For example, the delay generator 54 may be programmed to ensure that refresh events are spaced apart in the time domain to minimize power surges. The initiate refresh command from the master device may also send enabling signals to the first OR gate 42a. The enabling signals enable a voltage regulator 20 and a charge pump 22.

In some embodiments, the regulated voltages from the voltage regulator 20 and modified voltages from the charge pump 22 may be shared with other devices through the first and second supply sharing lines 7a, 7b. If the device is designated as the master device by the mode register 32, the charge pump 22 may be enabled by default through a third OR gate 47. In some embodiments, a subset of power demanding command(s) may also enable the charge pump 22 through the third OR gate 47. The power demanding command(s) may be carried by the signal interconnect 6, or other signal lines connecting the devices at locations analogous to the first supply sharing line 7a and the second supply sharing line 7b of FIG. 2.

The command decoder 36 may send signals for a bank activate command, a power demanding command, and/or a refresh command. These signals, as opposed to the SRM command signal, may not be sent to the AND gate 46. The signals can be sent to the second OR gate 42b. The signals may turn on the voltage regulator 20.

Figure 9:
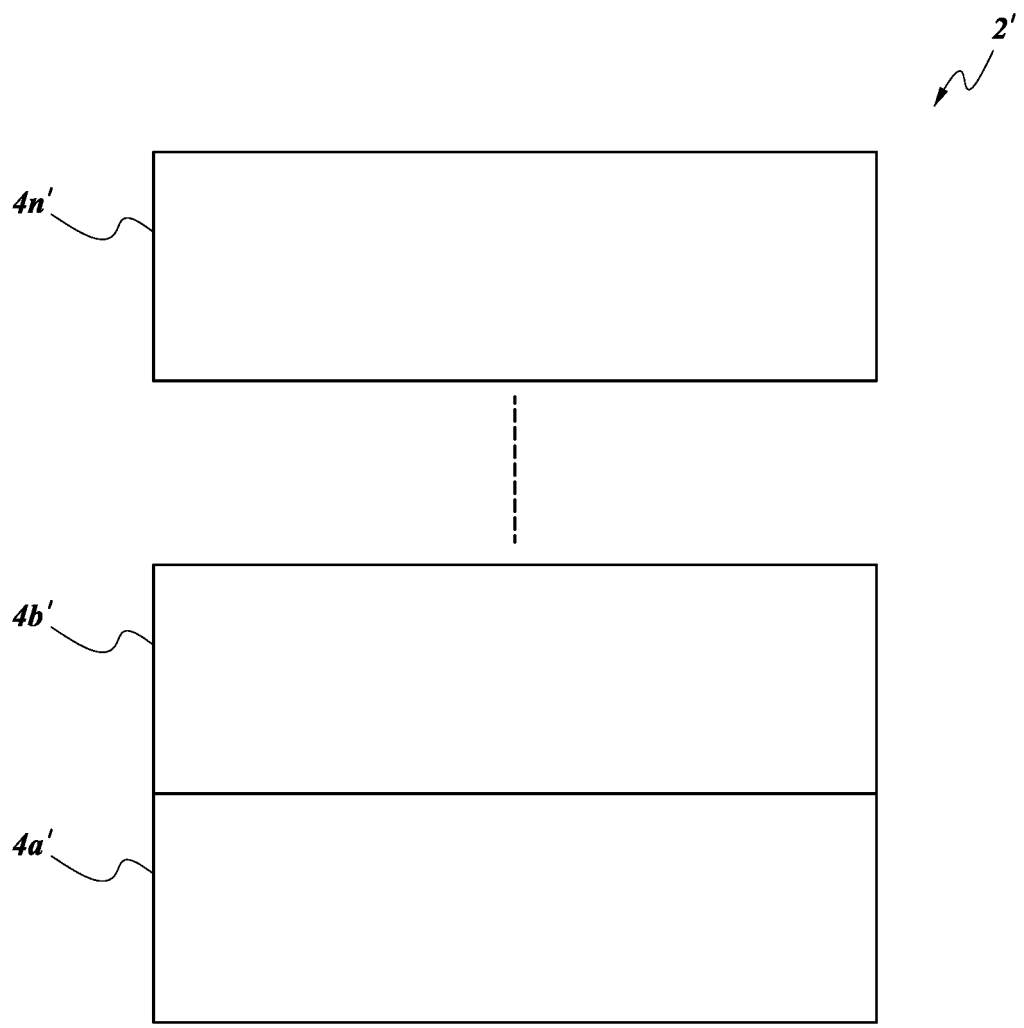
FIG. 9 illustrates a schematic side view of a module.

FIG. 9 illustrates a schematic side view of a module 2'. The illustrated module 2' includes stacked semiconductor devices 4a'-4n' (e.g., memory dies) stacked vertically. The module 2' can include any number of semiconductor devices. In some embodiments, the stacked semiconductor devices 4a'-4n' can be identical. The semiconductor devices 4a'-4n' can be electrically coupled by an interconnect (not shown).

In one aspect, a module is disclosed. The module includes a group of structurally identical dies that has a first die and a second die. The first die includes a first voltage block and the second die includes a second voltage block. The module also includes an interconnect electrically connecting the first and second dies. The first voltage block is enabled in a first condition, wherein the second voltage block is disabled in the first condition. The first and second die are enabled in a second condition.

In one embodiment, the first voltage block and the second voltage block are operable to provide at least one of voltage regulation or voltage generation.

In one embodiment, the second die further includes a second control circuit.

In one embodiment, the module further includes a power interconnect that is configured to provide externally regulated power to the second die.

In one embodiment, the first voltage block includes a first linear voltage regulator and the second voltage block includes a second linear voltage regulator.

In one embodiment, the first voltage block includes a first charge pump and the second voltage block includes a second charge pump. The first die can be configured to provide an enabling signal to the second die to enable the second charge pump in the second condition. The second voltage block can be disabled such that the second regulator is disabled and the second charge pump is enabled.

In one embodiment, the first die is vertically stacked with the second die.

In one embodiment, the group of structurally identical dies each comprise a memory circuit. The memory circuit can comprise a dynamic random-access memory (DRAM).

In one embodiment, the first die comprises a first plurality of voltage regulators and the second die comprises a second plurality of voltage regulators. In the first condition, all voltage regulators of the first die can be enabled and at least some voltage regulators of the second die are disabled.

In one embodiment, the first condition is a non-active mode, and the second condition is an active mode.

In one embodiment, the first voltage block provides a supply generated internally in the first voltage block to the second die in the first condition.

In one embodiment, of the module also includes a fuse or antifuse configured to designate at least one of the dies as a master die.

In one embodiment, the first die has a first control circuit that is configured to provide an enabling signal to the second die through the interconnect to enable the second voltage block in the second condition. The second die can include a second control circuit configured to provide a control signal. A first value of the control signal can serve to enable the second voltage block and a second value of the control signal can serve to disable the second voltage block.

In one aspect, a module is disclosed. The module includes a plurality of memory dies that are in communication with one another. At least one of the memory dies is designated as a master die and a remainder of the memory dies is designated as slave die(s). In a non-active mode, a master voltage block that is included in the master die is enabled and a corresponding slave voltage block that is included in each of the slave die(s) is disabled. In an active mode, the slave voltage block is enabled in one or more of the slave die(s).

In one embodiment, in the active mode, the slave die(s) enable the slave voltage blocks.

In one embodiment, the master voltage block comprises a master linear voltage regulator and a master charge pump.

In one embodiment, each of the slave voltage blocks comprises a slave linear voltage regulator and a slave charge pump.

In one embodiment, the memory dies comprise dynamic random-access memory (DRAM) dies.

In one embodiment, the master and slave dies are designated by hardware.

In one embodiment, the memory dies are structurally identical and the master and slave dies are designated by software. The memory dies can be, by default structured as master dies and can be designated by software to be slave dies. The memory dies can be, by default, structured as slave dies and can be designated by software to serve as master dies.

In one aspect, a method of operating a group of structurally similar dies that includes a master die and a slave die connected to one another is disclosed. The method includes enabling a first voltage block of the first die in a non-active mode. The method also includes disabling a second voltage block of the second die in the non-active mode. The method further includes transitioning from the non-active mode to an active mode and enabling both the first voltage block and the second voltage block in the active mode.

In one embodiment, the method further includes operating the second die with lower power in the non-active mode relative to the active mode.

In one embodiment, the method further includes generating a supply voltage using the first voltage block, and providing the supply voltage from the first die to the second die in the non-active mode. The supply voltage can be provided from the first die to the second die to support operations in the second d die during the non-active mode. The first and second dies can be connected by a supply sharing line configured to carry the supply voltage from the first die to the second die. The method further include electrically decoupling the supply sharing line from the second die's voltage block in the non-active mode. The method can also include supplying a first internally generated supply that is generated in the first die to a first circuit that is included in the first die and supplying a second internally generated supply that is generated in the second die to a second circuit that is included in the second die, in the active mode.

In one embodiment, the method further includes supplying voltage from the master die to the slave die in the non-active state.

In one embodiment, the method further includes sending enabling signals from the master die to the slave die to enable portions of the slave voltage block.

In one aspect, method of operating a group of structurally identical dies that includes a first die and a second die connected to one another is disclosed. The method includes supplying voltage from the first die to the second die in a non-active mode. The first die is in a high power mode and the second die is in a low power mode.

In one embodiment, the voltage is supplied from the first die to the second die to support operations in the second die during the non-active mode.

In one embodiment, the method further includes supplying a first internally generated supply that is generated in the first die to a first circuit that is included in the first die, and a second internally generated supply that is generated in the second die to a second circuit included in the second die, in an active mode. The voltage blocks of the first die and the second die are enabled in the active mode.

In one embodiment, the first and second dies are connected by a supply sharing line that is configured to carry the voltage from the first die to the second die. The second die electrically decouples the supply sharing line in the active mode.

In one aspect, method of operating a group of identical dies that includes a master die and slave dies connected to one another is disclosed. The method includes supplying control signals from the master die to the slave dies. The control signals schedule self-refresh operations among the slave dies.

In one embodiment, the control signals enable or disable voltage blocks of the slave dies.

In one embodiment, the group of identical dies includes a programmable delay generator. The method can further include scheduling timings of the self-refresh operations by the programmable delay generator.

In one aspect, a module is disclosed. The module includes a plurality of memory dies in communication with one another. At least one of the memory dies being designated as a master die and a remainder of the memory dies are designated as slave die(s). When the module is in a non-active mode, a master voltage block in the master die is enabled and a corresponding slave voltage block in the slave die(s) is disabled. In the non-active mode, the voltage block in the master die serves as a voltage supply for the slave die(s).

In one aspect, a module is disclosed. The module includes a group of structurally identical dies comprising a first die and a second die. In a non-active mode for the module, a power consumption of the first die has more enabled voltage blocks than the second die.

In one embodiment, the first die and the second die are in non-operation modes.

In one aspect, a method of operating a group of structurally identical dies each connected to one another and that comprise a master die and two or more slave dies is disclosed. The method includes providing a plurality of control signals from the master die to the two or more slave dies. The method also include controlling a memory refresh operation of the two or more slave dies based on the plurality of control signals.

In one embodiment, the memory refresh operation includes scheduling a plurality of self-refresh operations among the two or more slave dies.

In one embodiment, the method further includes using the control signals to selectively enable or disable a plurality of voltage blocks of the slave dies.

In one embodiment, scheduling the plurality of self-refresh operations further includes programming a delay of a programmable delay generator of the two or more slave devices.

In one aspect, a module is disclosed. The module includes a plurality of semiconductor dies that are in communication with one another and each including a memory. The plurality of semiconductor dies partitioned into at least one master die and at least one slave die. The at least one master die includes a master voltage block, and the at least one slave die includes a slave voltage block. When the module is in a non-active mode, the master voltage block is enabled and the slave voltage block is disabled, and the master voltage block is configured to provide a supply voltage to the at least one slave die.

In one embodiment, when the module is in an active mode, the master voltage block and the slave voltage block are both enabled.

In one aspect, module is disclosed. The module includes a group of structurally identical dies that include a first die and a second die that are electrically connected to one another. In a non-active mode of the module, a number of enabled voltage blocks of the first die is greater than a number of enabled voltage blocks of the second die.

In one embodiment, the first die and the second die are in at least one of a sleep state or a standby state in the non-active mode.

In one aspect, a module is disclosed. The module includes a group of structurally identical dies that includes a first die that has a first voltage block and a first control circuit and a second die that has a second control circuit and a second voltage block. The module also includes an interconnect electrically connecting the first and second dies. The first voltage block is enabled and the second voltage block is disabled, in a first condition. The first and second voltage blocks are enabled in a second condition.

In one embodiment, the second control circuit is configured to provide a control signal. One value of the signal can serve to enable the second voltage block and a second value of the signal can serve to disable the second voltage block. When the second voltage block is enabled, the output of the second voltage block can provide voltages to circuitry in the second die. A first voltage generated by the first voltage block can be coupled to the interconnect to provide voltage to the circuitry in the second die.

In one embodiment, the second voltage block in the second die comprises voltage control circuitry that is coupled to voltage generation circuitry in the second die. The voltage control circuitry can enables or disables the voltage generation circuitry in the second die. The voltage generation circuitry in the second die can provide voltages to memory circuitry in the second die. The voltage control circuitry of the second die can be disabled by the second control circuit. An output of the voltage control circuit in the second die can be decoupled from an input of the voltage generation circuit in the second die. The input to voltage generation circuit in the second die can be coupled to an output of the voltage control circuit in the first die. When the voltage generation circuit in the second die is enabled, the output of the voltage generation circuit in the second die can be decoupled to the output of a voltage generation circuit in the first die. The voltage generation circuit in the second die can be configured to be enabled by the control circuit in the second die. When the voltage generation circuit in the second die is disabled in a non-active mode, the output of the voltage generation circuit in the second die can be decoupled from the interconnect to provide voltages to the circuitry in the second die. The output of a voltage generation circuitry in the first die can be coupled to the interconnect to provide voltages to the circuitry in the second die. The voltage generation circuitry in the second die can be configured to be disabled by the second control circuit. The module can comprise dynamic memory devices. The activation of the voltage generation circuitry in the second die can be configured to be enabled by commands received by the control circuitry in the second die. An enabling command received by the control circuitry of the second die can be a refresh command. An enabling command received by the control circuitry of the second die can be a bank activate command. An enabling command received by the control circuitry of the second die can be a refresh mode command.

In one embodiment, when a self-refresh timing and a self-refresh control logic are enabled in the first die, a self-refresh timing and a self-refresh control logic in the second die are disabled. The refresh control logic of the first die can send a refresh initiation command and send the refresh initiation command to the second die. A programmable delay generator in the second die can generate a refresh command based at least in part on the received refresh initiation command and a programmable time. The second die can enable a voltage generation circuitry in the second die in response to the refresh command. The programmable time can be programmed based at least in part on reconfigurable non-volatile memory. The second die can enable a voltage generation circuitry in the second die in response to the refresh initiation command.

In one embodiment, the first and second control circuits are defined based at least in part on fuses.

In one embodiment, the first and second control circuits are defined based at least in part on reconfigurable non-volatile memory.

In one embodiment, the interconnect comprises a voltage bus configured to carry voltages between the dies.

In one embodiment, the configuration of the control circuits of the first and second dies can determine a response of the first and second voltage generation blocks to commands received by the control circuit.

In one embodiment, the first and second control circuits are defined based at least in part on fuses.

In one embodiment, the first and second control circuits are defined based at least in part on reconfigurable non-volatile memory.

In one embodiment, the interconnect comprises a voltage bus configured to carry voltages between the dies.

In one embodiment, the configuration of the control circuits of the first and second dies determines a response of the first and second voltage generation blocks to commands received by the control circuit In one aspect, a module is disclosed. The module includes a group of structurally identical dies. The group of structurally identical dies includes a first die that has a first control circuit and a second die that has a second control circuit. The module also includes an interconnect that electrically connects the first and second dies. When a self-refresh timing and a self-refresh control logic in the first die are enabled by the first control circuit, a self-refresh timing and a self-refresh control logic in the second die are disabled by the second control circuit in a self-refresh mode.

In one embodiment, the self-refresh control logic of the first die is configured to send a refresh initiation command to the second die by way of the interconnect.

In one embodiment, a programmable delay generator in the second die is configured to generate a local refresh command based at least in part on the received refresh initiation command and a programmable time.

In one embodiment, a refresh operation of a dynamic memory of the first die and a refresh operation of a dynamic memory of the second die are staggered in time.

In one embodiment, the programmable time is defined based at least in part on fuses.

In one embodiment, the programmable time is defined based at least in part on data programmed in a reconfigurable non-volatile memory.

In one embodiment, the second die is configured to enable a voltage generation circuit in the second die in response to the refresh initiation command.

In one embodiment, the first die comprises an oscillator configured to generate the refresh initiation command, wherein the second die comprises an oscillator that is disabled when the oscillator of the first die is enabled.

A method of controlling timing of self-refresh operations of multiple dies is disclosed. The method includes communicating amongst a group of structurally identical dies using an interconnect. The group of structurally identical dies includes a first die that has a first control circuit and a second die that has a second control circuit. The method also includes disabling a self-refresh timing and a self-refresh control logic in the second die using the second control circuit. The method further includes enabling a self-refresh timing and a self-refresh control logic in the first die using the first control circuit when the self-refresh timing and the self-refresh control logic in the second die are disabled.

In one embodiment, the method further includes sending a refresh initiation command from the self-refresh control logic of the first die to the second die by way of the interconnect.

In one embodiment, the method further includes generating a local refresh command in the second die in response to the refresh initiation command using a programmable delay generator of the second die. The method can also include staggering a refresh operation of a dynamic memory of the first die and a refresh operation of a dynamic memory of the second die. The method can also include generating the local refresh command based on a programmable time.

In one embodiment, the method further includes enabling a voltage generation circuit in the second die in response to the refresh initiation command.

In one embodiment, the method further includes generating the refresh initiation command using an oscillator of the first die, and disabling an oscillator of the second die when the oscillator of the first die is enabled.

In one aspect, a module is disclosed. The module includes a group of structurally identical dies that includes a first die that has a first circuit block and a second die that has a second circuit block. The module also includes an interconnect that electrically connects the first and second dies. The first circuit block is enabled in a first condition and the second circuit block is disabled in the first condition. The first and second circuit blocks are enabled in a second condition.

In one embodiment, the first circuit block includes a self-refresh timing and a self-refresh control logic of the first die, and wherein the second circuit block includes a self-refresh timing and a self-refresh control logic of the second die. The first die can further include a first control circuit and the second die can further include a second control circuit. When the self-refresh timing and the self-refresh control logic in the first die are enabled by the first control circuit in the first condition, the self-refresh timing and the self-refresh control logic in the second die are disabled by the second control circuit. The self-refresh control logic of the first die can be configured to send a refresh initiation command to the second die by way of the interconnect.

In one embodiment, the first circuit block includes a first voltage block and the second circuit block includes a second voltage block. The first voltage block and the second voltage block are operable to provide at least one of voltage regulation or voltage generation.

Although disclosed in the context of certain embodiments and examples, it will be understood by those skilled in the art that the present invention extends beyond the specifically disclosed embodiments to other alternative embodiments and/or uses and obvious modifications and equivalents thereof. In addition, while several variations have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the present disclosure. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the aspects that follow.

What is claimed is:

1. A module comprising:
a group of structurally identical dies comprising a first die having a first control circuit and a first delay generator, and a second die having a second control circuit and a second delay generator; and
an interconnect electrically connecting the first and second dies,
wherein when a self-refresh timing and a self-refresh control logic in the first die are enabled by the first control circuit to send a refresh initiation command to the first delay generator and the second delay generator, a self-refresh timing and a self-refresh control logic in the second die are disabled by the second control circuit in a self-refresh mode.

2. The module of claim 1, wherein the self-refresh control logic of the first die is configured to send the refresh initiation command to the second delayer generator of the second die by way of the interconnect.

3. The module of claim 2, wherein the second delay generator is a programmable delay generator that is configured to generate a local refresh command based at least in part on the received refresh initiation command and a programmable time.

4. The module of claim 3, wherein a refresh operation of a dynamic memory of the first die and a refresh operation of a dynamic memory of the second die are staggered in time.

5. The module of claim 3, wherein the programmable time is defined based at least in part on fuses.

6. The module of claim 3, wherein the programmable time is defined based at least in part on data programmed in a reconfigurable non-volatile memory.

7. The module of claim 2, wherein the second die is configured to enable a voltage generation circuit in the second die in response to the refresh initiation command.

8. The module of claim 2, wherein the first die comprises an oscillator configured to generate the refresh initiation command, wherein the second die comprises an oscillator that is disabled when the oscillator of the first die is enabled.

9. A method of controlling timing of self-refresh operations of multiple dies, the method comprising:
communicating amongst a group of structurally identical dies using an interconnect, the group of structurally identical dies including a first die having a first control circuit and a first delay generator, and a second die having a second control circuit and a second delay generator;
enabling a self-refresh timing and a self-refresh control logic in the first die using the first control circuit to send a refresh initiation command to the first delay generator and the second delay generator; and
disabling a self-refresh timing and a self-refresh control logic in the second die using the second control circuit when the self-refresh timing and the self-refresh control logic in the first die are enabled.

10. The method of claim 9, further comprising sending the refresh initiation command from the self-refresh control logic of the first die to the second delay generator of the second die by way of the interconnect.

11. The method of claim 10, further comprising generating a local refresh command in the second die in response to the refresh initiation command using the second delayer generator, wherein the second delay generator is a programmable delay generator.

12. The method of claim 11, further comprising staggering a refresh operation of a dynamic memory of the first die and a refresh operation of a dynamic memory of the second die.

13. The method of claim 11, further comprising generating the local refresh command based on a programmable time.

14. The method of claim 10, further comprising enabling a voltage generation circuit in the second die in response to the refresh initiation command.

15. The method of claim 10, further comprising generating the refresh initiation command using an oscillator of the first die, and disabling an oscillator of the second die when the oscillator of the first die is enabled.

16. A module comprising:
a group of structurally identical dies comprising a first die having a first circuit block and a second die having a second circuit block; and
an interconnect electrically connecting the first and second dies,
wherein the first circuit block is enabled in a first condition such that the first circuit is configured to send a refresh initiation command to initiate refresh of the first die and the second die in the first condition, or supply power to the first die and the second die in the first condition,
wherein the second circuit block is disabled in the first condition, and
wherein the first and second circuit blocks are enabled in a second condition.

17. The module of claim 16, wherein the first circuit block includes a self-refresh timing and a self-refresh control logic of the first die, and wherein the second circuit block includes a self-refresh timing and a self-refresh control logic of the second die.

18. The module of claim 17, wherein the first die further includes a first control circuit and the second die further includes a second control circuit, wherein when the self-refresh timing and the self-refresh control logic in the first die are enabled by the first control circuit in the first condition, the self-refresh timing and the self-refresh control logic in the second die are disabled by the second control circuit.

19. The module of claim 17, wherein the self-refresh control logic of the first die is configured to send the refresh initiation command to the second die by way of the interconnect.

20. The module of claim 16, wherein the first circuit block includes a first voltage block and the second circuit block includes a second voltage block, wherein the first voltage block and the second voltage block are operable to provide at least one of voltage regulation or voltage generation.

21. A method of operating a group of structurally identical dies each connected to one another and comprising a master die and two or more slave dies, the method comprising:
providing a plurality of control signals from a control circuit of the master die to a plurality of delay generators including a delay generator of each of the master die and the two or more slave dies; and
controlling a memory refresh operation of the two or more slave dies based on the plurality of control signals.

22. The method of claim 21, wherein controlling the memory refresh operation comprises scheduling a plurality of self-refresh operations among the two or more slave dies.

23. The method of claim 21, further comprising using the control signals to selectively enable or disable a plurality of voltage blocks of the slave dies.

24. The method of claim 22, wherein scheduling the plurality of self-refresh operations further comprises programming a delay of a programmable delay generator of the two or more slave dies.

* * * * *